(12) United States Patent
Hirano et al.

(10) Patent No.: US 11,877,396 B2
(45) Date of Patent: Jan. 16, 2024

(54) LAMINATE, METAL FOIL-CLAD LAMINATE, LAMINATE HAVING PATTERNED METAL FOIL, LAMINATE HAVING BUILDUP STRUCTURE, PRINTED WIRING BOARD, MULTILAYER CORELESS SUBSTRATE, AND METHOD FOR PRODUCING SAME

(71) Applicant: MITSUBISHI GAS CHEMICAL COMPANY, INC., Tokyo (JP)

(72) Inventors: Syunsuke Hirano, Yamagata (JP); Yoshihiro Kato, Fukushima (JP); Takaaki Ogashiwa, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 299 days.

(21) Appl. No.: 17/271,062

(22) PCT Filed: Aug. 16, 2019

(86) PCT No.: PCT/JP2019/032098
§ 371 (c)(1),
(2) Date: Feb. 24, 2021

(87) PCT Pub. No.: WO2020/045112
PCT Pub. Date: Mar. 5, 2020

(65) Prior Publication Data
US 2021/0204404 A1    Jul. 1, 2021

(30) Foreign Application Priority Data
Aug. 30, 2018  (JP) ................................ 2018-161406

(51) Int. Cl.
*H05K 1/03* (2006.01)
*C08G 18/58* (2006.01)
(Continued)

(52) U.S. Cl.
CPC ............. *H05K 1/036* (2013.01); *C08G 18/58* (2013.01); *C08G 18/7692* (2013.01);
(Continued)

(58) Field of Classification Search
CPC .... H05K 1/03; H05K 3/4682; H01L 21/4857; H01L 23/145; H01L 23/49822; C08G 18/58; C08G 18/7692
See application file for complete search history.

(56) References Cited

U.S. PATENT DOCUMENTS

| 2003/0162006 A1 | 8/2003 | Ikeguchi et al. |
| 2004/0091688 A1 | 5/2004 | Gaku et al. |

(Continued)

FOREIGN PATENT DOCUMENTS

| JP | 59-500341 A | 3/1984 |
| JP | 2002-307608 A | 10/2002 |

(Continued)

OTHER PUBLICATIONS

International Search Report issued in International Patent Application No. PCT/JP2019/032098, dated Sep. 24, 2019, along with an English translation thereof.
Written Opinion of International Searching Authority issued in International Patent Application No. PCT/JP2019/032098, dated Sep. 24, 2019, along with an English translation thereof.

*Primary Examiner* — Laura C Powers
(74) *Attorney, Agent, or Firm* — GREENBLUM & BERNSTEIN, P.L.C.

(57) ABSTRACT

Provided is a laminate containing a first resin composition layer, a heat-resistant film layer, and a second resin composition layer laminated in the presented order, wherein the first resin composition layer is in a semi-cured state (B stage), and a difference between a maximum thickness and a minimum thickness of the first resin composition layer is 0.5 to 5 μm; and the second resin composition layer is in a semi-cured state (B stage), and a difference between a (Continued)

maximum thickness and a minimum thickness of the second resin composition layer is 0.5 to 5 μm.

13 Claims, 1 Drawing Sheet

(51) Int. Cl.
  *H01L 21/48* (2006.01)
  *H01L 23/14* (2006.01)
  *H01L 23/498* (2006.01)
  *H05K 3/46* (2006.01)
  *C08G 18/76* (2006.01)

(52) U.S. Cl.
  CPC ........ *H01L 21/4857* (2013.01); *H01L 23/145* (2013.01); *H01L 23/49822* (2013.01); *H05K 3/4682* (2013.01)

(56) References Cited

U.S. PATENT DOCUMENTS

| 2007/0231469 | A1* | 10/2007 | Lin ................ H05K 3/4661 428/209 |
| 2010/0068511 | A1 | 3/2010 | Matsunaga et al. |
| 2014/0027156 | A1 | 1/2014 | Kim et al. |

FOREIGN PATENT DOCUMENTS

| JP | 2003-251757 A | 9/2003 |
| JP | 2005-41148 A | 2/2005 |
| JP | 2005-74933 A | 3/2005 |
| JP | 2012-45887 A | 3/2012 |
| JP | 2013-64078 A | 4/2013 |
| WO | 1983/03065 A1 | 9/1983 |

* cited by examiner

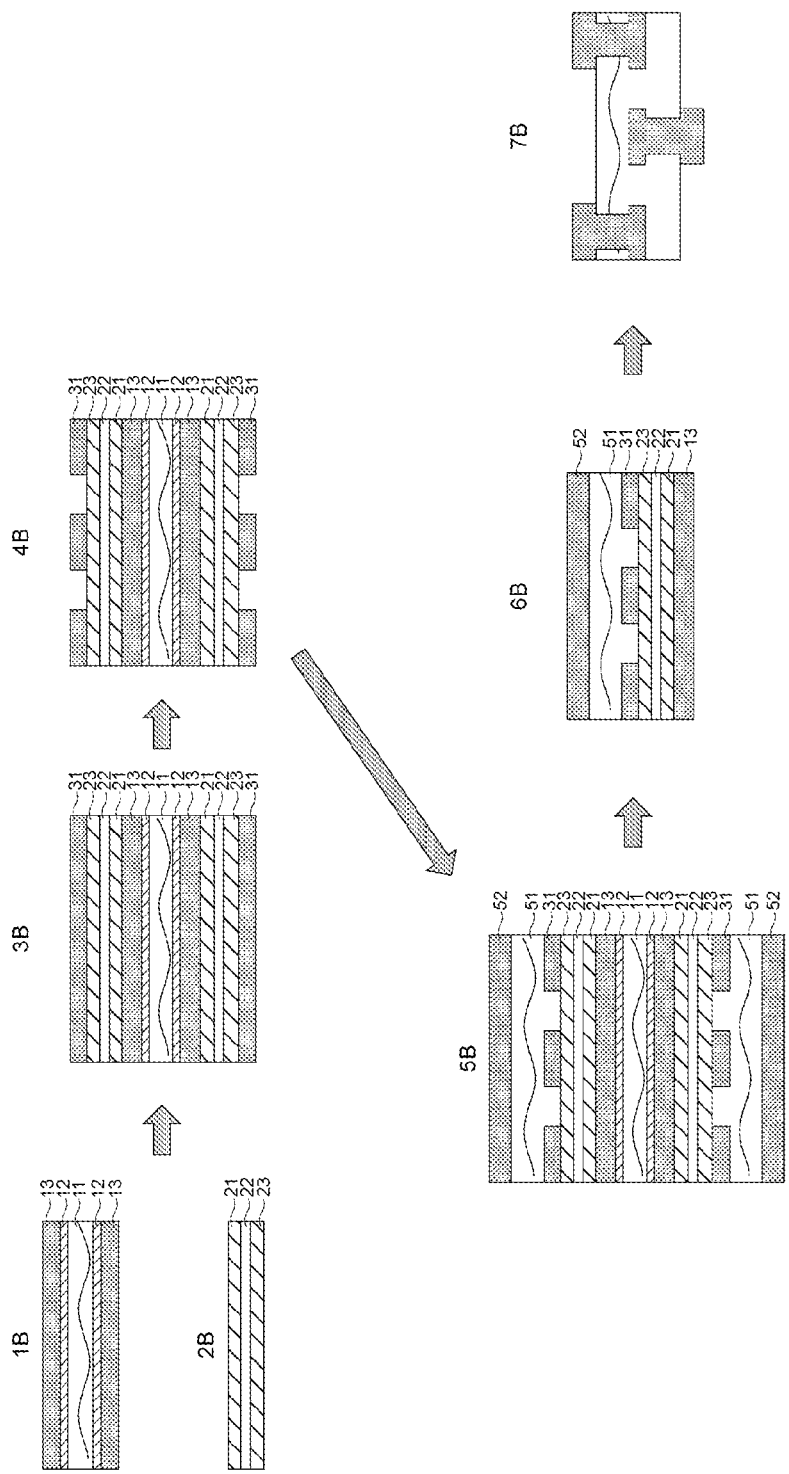

LAMINATE, METAL FOIL-CLAD LAMINATE, LAMINATE HAVING PATTERNED METAL FOIL, LAMINATE HAVING BUILDUP STRUCTURE, PRINTED WIRING BOARD, MULTILAYER CORELESS SUBSTRATE, AND METHOD FOR PRODUCING SAME

TECHNICAL FIELD

The present invention relates to a laminate, a metal foil-clad laminate, a laminate having a patterned metal foil, a laminate having a buildup structure, a printed wiring board, a multilayer coreless substrate, and a method for producing the same. Specifically, the present invention relates to a laminate useful as a buildup material for printed wiring boards and multilayer coreless substrates.

BACKGROUND ART

Function enhancement and downsizing of semiconductor packages broadly used in electronic apparatuses, communication apparatuses, personal computers and the like have recently been increasingly accelerated. Along therewith, thickness reduction of printed wiring boards, multilayer coreless substrates, and package substrates for loading semiconductor devices in the semiconductor packages has also been demanded.

For example, Patent Document 1 discloses a method for producing a thin printed wiring board, multilayer coreless substrate, and substrate for loading a semiconductor device in which: a circuit pattern is formed, by pattern plating, on a laminate in which a copper layer peelable in a later step is formed on a high-stiffness thick support substrate (carrier substrate) such as a stainless steel one; an insulating resin layer such as an epoxy resin-coated fiber glass is laminated thereon and subjected to heating and pressurizing treatment; and finally the support substrate is peeled and removed to thereby produce the thin printed wiring board, multilayer coreless substrate and substrate for loading a semiconductor device. By thus laminating a circuit pattern and an insulating resin layer on a high-stiffness thick support substrate and finally peeling and removing the support substrate, a thin printed wiring board, multilayer coreless substrate, and substrate for loading a semiconductor device can be produced even using an existing production apparatus.

A method based on a buildup system in which an insulating resin layer and a conductor layer are alternately stacked on a core substrate is known as a method for producing a printed wiring board and a package substrate for loading a semiconductor device. Further, a method in which: an insulating resin layer and a conductor layer are alternately stacked on a core substrate; and finally the core substrate is removed is known as a method for producing a multilayer coreless substrate. Prepregs or resin sheets are usually used in insulating resin layer formation.

Such prepregs are obtained by impregnating or coating a base material with a resin composition and then semi-curing (converting into B stage) the resin composition.

For example, sheets containing a heat-resistant film base material in which a resin composition layer in a semi-cured state (B stage) is formed on each of both surfaces of a heat-resistant film are used as the resin sheets (Patent Document 2).

CITATION LIST

Patent Document

Patent Document 1: National Publication of International Patent Application No. 1984-500341
Patent Document 2: Japanese Patent Laid-Open No. 2003-251757

SUMMARY OF INVENTION

Technical Problem

However, when with the aim of further thickness reduction, laminates having a patterned metal foil, laminates having a buildup structure, printed wiring boards, multilayer coreless substrates, and substrates for loading semiconductor devices (hereinafter, these laminates, printed wiring boards and substrates are also referred to as "printed wiring boards, etc.") are intended to be produced without using support substrates, if existing production apparatuses are used, for example the following problems arise: the printed wiring boards, etc. are broken; and the printed wiring boards, etc. are wound around conveyers. Hence, it is difficult to produce printed wiring boards, etc., with the aim of thickness reduction satisfying market needs, by using existing production apparatuses.

Prepregs are obtained by coating or impregnating a base material such as a glass cloth with a resin composition and are therefore excellent in strength. However, the thicknesses of the prepregs depend on the thickness of the glass cloth. Hence, thickness reduction satisfying market needs is very difficult for prepregs, and it is difficult to obtain thin printed wiring boards, etc. even if prepregs are used, because high-density fine wiring is formed.

Unlike prepregs, resin sheets containing a resin composition layer in a semi-cured state are obtained without using base materials such as glass cloths and therefore attain thickness reduction and are excellent in tenacity. However, their problems are low strength. In this respect, in Patent Document 2, a resin sheet is fabricated using a heat-resistant film. However, Patent Document 2 has room for improvement in close contact between the heat-resistant film and a resin composition layer and is limited by thickness reduction of the resin sheet, because the resin composition layer is merely laminated on the heat-resistant film. Hence, even in this resin sheet, high-density fine wiring is formed, and thus thin printed wiring boards, etc. cannot be obtained.

The present invention has been achieved in consideration of these problems, and an object thereof is to provide a high-strength and thin laminate wherein a thin and high-strength metal foil-clad laminate can suitably be produced by using this laminate. Another object of the present invention is to provide a laminate wherein a thin and high-strength laminate having a patterned metal foil, laminate having a buildup structure, printed wiring board, multilayer coreless substrate, and substrate for loading a semiconductor device, in which high-density fine wiring is formed can suitably be produced.

Solution to Problem

As a result of exhaustive studies, the present inventors have found that a laminate in which a resin composition layer in a semi-cured state (converted into B stage) having a specific range of a difference between a maximum thickness and a minimum thickness of the resin composition layer is disposed on each of both surfaces of a heat-resistant film layer has high strength, and this laminate can be thin because the thin heat-resistant film and the thin resin composition layer disposed on each of both surfaces of the film are favorably closely contacted with each other. The present inventors have further found that a thin and high-strength metal foil-clad laminate is obtained by using this laminate, and a thin and high-strength laminate having a patterned metal foil, laminate having a buildup structure, printed wiring board, multilayer coreless substrate (and a method for producing the same), and substrate for loading a semiconductor device, in which high-density fine wiring is formed are obtained. These findings have led to the completion of the present invention.

That is, the present invention encompasses the following contents.

[1] A laminate comprising a first resin composition layer, a heat-resistant film layer, and a second resin composition layer laminated in the presented order, wherein the first resin composition layer is in a semi-cured state (B stage), and a difference between a maximum thickness and a minimum thickness of the first resin composition layer is 0.5 to 5 µm; and the second resin composition layer is in a semi-cured state (B stage), and a difference between a maximum thickness and a minimum thickness of the second resin composition layer is 0.5 to 5 µm.

[2] The laminate according to [1], wherein a thickness of the heat-resistant film layer is 1 to 20 µm.

[3] The laminate according to [1] or [2], wherein the heat-resistant film layer comprises one or more resins selected from the group consisting of a polyimide resin, a polyamide imide resin, a nylon resin, and a fluorine resin.

[4] The laminate according to any of [1] to [3], wherein the first resin composition layer comprises one or more resins selected from the group consisting of a phenolic resin, an epoxy resin, a cyanate resin, a maleimide resin, an isocyanate resin, a benzocyclobutene resin, a bismaleimide triazine resin, and a vinyl resin.

[5] The laminate according to any of [1] to [4], wherein the second resin composition layer comprises one or more resins selected from the group consisting of a phenolic resin, an epoxy resin, a cyanate resin, a maleimide resin, an isocyanate resin, a benzocyclobutene resin, a bismaleimide triazine resin, and a vinyl resin.

[6] The laminate according to any of [1] to [5], for use in a printed wiring board.

[7] A metal foil-clad laminate comprising the laminate according to any of [1] to [6], and a metal foil disposed on one surface or both surfaces of the laminate.

[8] A laminate having a patterned metal foil, comprising the laminate according to any of [1] to [6], and a patterned metal foil disposed on one surface or both surfaces of the laminate.

[9] A laminate having a buildup structure, comprising the laminate according to any of [1] to [6], and a conductor layer alternately laminated.

[10] A printed wiring board comprising the laminate according to any of [1] to [6].

[11] A multilayer coreless substrate comprising the laminate according to any of [1] to [6], and one or a plurality of conductor layers disposed on each of both surfaces of the laminate, and comprising an insulating resin layer placed between every two of the plurality of conductor layers.

[12] A method for producing a multilayer coreless substrate, comprising a step of laminating the first resin composition layer or the second resin composition layer for the laminate according to any of [1] to [6] onto a conductor layer surface.

Advantageous Effects of Invention

According to the present invention, a high-strength and thin laminate can be obtained. Also, a thin and high-strength metal foil-clad laminate can suitably be obtained by using the laminate of the present invention. Further, a thin and high-strength laminate having a patterned metal foil, laminate having a buildup structure, printed wiring board, multilayer coreless substrate, and substrate for loading a semiconductor device, in which high-density fine wiring is formed can suitably be obtained. According to the present invention, a thin and high-strength multilayer coreless substrate in which high-density fine wiring is formed can suitably be produced.

BRIEF DESCRIPTION OF DRAWING

FIG. 1 is a schematic view illustrating a step of fabricating a 3-layer coreless substrate in Example 2.

DESCRIPTION OF EMBODIMENTS

Hereinafter, a mode for carrying out the present invention (hereinafter, referred to as the "present embodiment") will be described in detail. The present embodiment given below is a mere illustration for describing the present invention and does not intend to limit the present invention by the contents given below. The present invention can be carried out through appropriate changes or modifications without departing from the spirit of the present invention.

In the present specification, the term "(meth)acryloyl group" means both of an "acryloyl group" and a "methacryloyl group" corresponding thereto; the term "(meth)acrylate" means both of "acrylate" and "methacrylate" corresponding thereto; the term "(meth)acrylic acid" means both of "acrylic acid" and "methacrylic acid" corresponding thereto; and the term "(meth)acryloyl" means both of "acryloyl" and "methacryloyl" corresponding thereto.

In the present embodiment, the term "resin solid content", "resin solid content in the first resin composition layer" or "resin solid content in the second resin composition layer" refers to components except for fillers, solvents, and additives in the first or second resin composition layer, and the term "100 parts by mass of the resin solid content" refers to 100 parts by mass in total of the components except for fillers, solvents, and additives in the first or second resin composition layer, unless otherwise specified.

[Laminate]

The laminate of the present embodiment contains a first resin composition layer, a heat-resistant film layer, and a second resin composition layer laminated in the presented order. In the present embodiment, the first resin composition layer is in a semi-cured state (B stage), and a difference between a maximum thickness and a minimum thickness of the first resin composition layer is 0.5 to 5 µm. Also, the second resin composition layer is in a semi-cured state (B stage), and a difference between a maximum thickness and a minimum thickness of the second resin composition layer is 0.5 to 5 µm.

The first and second resin composition layers having a specific range of the difference between the maximum thickness and the minimum thickness of the resin composition layer according to the present embodiment are very thin, can obtain favorable close contact between the resin composition layer and a heat-resistant film, and can obtain excellent tenacity. The heat-resistant film layer is thin, is excellent in heat resistance, and has high stiffness. Hence, according to the present embodiment, a very high-strength and thin laminate can be obtained.

The laminate of the present embodiment can be used in production of electronic apparatuses, communication apparatuses, and personal computers and the like and is useful as a buildup material for a metal foil-clad laminate, and a printed wiring board, etc. When metal foil-clad laminates, and printed wiring boards, etc. are produced using the laminate of the present embodiment, these metal foil-clad laminates, and printed wiring boards, etc. can suitably be produced without the thin and yet high-strength laminate of the present embodiment being destroyed in the production process. In the laminate of the present embodiment, the resin composition layers in a semi-cured state having a specific range of the difference between the maximum thickness and the minimum thickness of the resin composition layer are disposed on both surfaces of the heat-resistant film layer. Hence, particularly, the laminate, the metal foil-clad laminate, and the printed wiring board, etc. obtained by buildup using a thin inner layer board such as a metal foil of the present embodiment have high mechanical strength, small warpage and distortion, and less variation in forming thickness at the time of lamination, as compared with printed wiring boards obtained using a resin sheet containing no base material. Thin, high-strength, and high-density printed wiring boards, etc. such as CSP (chip size package) can suitably be obtained by using the laminate of the present embodiment.

In metal foil-clad laminates, and printed wiring boards, etc., a metal foil is laminated on a resin composition layer. Since a resin composition layer having a smooth surface cannot produce, for example, an anchor effect, close contact between the resin composition layer and a metal foil layer is worsened, easily generating voids. Accordingly, metal foil layers usually undergo roughening treatment in order to obtain an anchor effect. However, in this case, if there is variation in resin thickness, voids are generated in portions with a small resin content in the resin composition layer so that the laminate is destroyed as a whole. By contrast, in the laminate of the present embodiment, the resin composition layer has no variation in thickness and is favorably closely contacted with even a metal foil layer that has undergone roughening treatment, because the resin composition layer is in a semi-cured state and has a specific range of the difference between the maximum thickness and the minimum thickness. Furthermore, in the present embodiment, favorable close contact between a heat-resistant film and the resin composition layer and favorable close contact between the resin composition layer and a metal foil layer are obtained by controlling the difference between the maximum thickness and the minimum thickness of the resin composition layer within a very thin range. Hence, such a thin laminate, even when used, does not generate voids, and the laminate is not destroyed. Thus, thin and high-strength metal foil-clad laminates, and thin and high-strength printed wiring boards, etc. in which high-density fine wiring is formed can suitably be produced.

For production of printed wiring boards, etc., even if a metal foil is etched and then subjected to plating treatment, the resin composition layer is favorably closely contacted with the plated layer, because the resin composition layer is favorably closely contacted with an unetched metal foil layer and further, has no variation in thickness. Hence, thin printed wiring boards, etc. in which high-density fine wiring is formed can be obtained by using the laminate of the present embodiment.

<Heat-Resistant Film Layer>

The heat-resistant film layer is not especially limited as long as being a film containing a heat-resistant resin.

The thickness of the heat-resistant film layer is not especially limited, and is preferably 1 to 20 μm, more preferably 3 to 15 μm, and still more preferably 4 to 10 μm from the viewpoint of improvement in handleability of metal foil-clad laminates and printed wiring boards, etc. and improvement in tenacity of metal foil-clad laminates and printed wiring boards, etc.

Examples of the heat-resistant resin include polyimide resins, polyamide imide resins, nylon resins, and fluorine resins. These heat-resistant resins may be used singly, or two or more thereof may be used as a mixture. Among these heat-resistant resins, polyimide resins and polyamide imide resins are preferable from the viewpoint of heat resistance.

Examples of the polyimide resin include, but are not especially limited to, polyamide imide, polypyromellite-diimide, bismaleimide, and polyether imide. These polyimide resins may be used singly, or two or more thereof may be used as a mixture. A commercially available product may be used as the polyimide resin, and, for example, a polyimide resin manufactured by Du Pont-Toray Co., Ltd. can be used.

Examples of the polyamide imide resin include, but are not especially limited to: resins obtained by heating trimellitic anhydride, benzophenonetetracarboxylic anhydride, and bitolylene diisocyanate in a N-methyl-2-pyrrolidone and/or N,N-dimethylacetamide solvent; and resins obtained by heating trimellitic anhydride, diphenylmethane diisocyanate, and carboxyl group-terminated (meth)acrylonitrile-butadiene rubber in a solvent such as N-methyl-2-pyrrolidone and/or N,N-dimethylacetamide. These polyamide imide resins may be used singly, or two or more thereof may be used as a mixture.

Examples of the nylon resin include, but are not especially limited to, nylon 6, nylon 6,6', and aramide. These nylon resins may be used singly, or two or more thereof may be used as a mixture.

Examples of the fluorine resin include, but are not especially limited to, polytetrafluoroethylene, polyvinylidene fluoride, and polychlorotrifluoroethylene. These fluorine resins may be used singly, or two or more thereof may be used as a mixture.

The heat-resistant film layer may be a heat-resistant film layer having an adhesive resin layer. When the heat-resistant film layer is a heat-resistant film layer having an adhesive resin layer, the heat-resistant film layer is disposed such that the adhesive resin layer surface is in contact with the resin composition layer.

Examples of the resin constituting the adhesive resin layer include, but are not especially limited to, phenolic resins, epoxy resins, cyanate resins, maleimide resins (maleimide compounds), isocyanate resins, benzocyclobutene resins, bismaleimide triazine resins (also referred to as "BT resins"), and vinyl resins. These resins constituting the adhesive resin layer may be used singly, or two or more thereof may be used as a mixture. Respective specific examples of the phenolic resin, the epoxy resin, the cyanate resin, the maleimide resin (maleimide compound), the isocyanate resin, the benzocyclobutene resin, the bismaleimide triazine resin, and the vinyl resin are as described in a thermosetting resin for use in the first and second resin composition layers mentioned later.

A commercially available product may be used as the heat-resistant film having an adhesive resin layer, and, for example, CISV (trade name) manufactured by Nikkan Industries Co., Ltd. can be used.

In the case of forming a resin composition layer on a surface of the heat-resistant film layer, no treatment may be performed whereas a treatment such as corona treatment, plasma treatment, low ultraviolet treatment, chemical treatment, and sandblast treatment may be performed in order to improve adhesiveness to the resin composition layer.

<First Resin Composition Layer>

The first resin composition layer is not especially limited as long as the first resin composition layer is in a semi-cured state (B stage) and the difference between the maximum thickness and the minimum thickness of the first resin composition layer is 0.5 to 5 μm.

In the present embodiment, the semi-cured state (B stage) refers to a state in which although each component contained in the resin composition layer has not actively initiated reaction (curing), the resin composition has been heated into a dry state, i.e., to an extent free from stickiness, to volatilize a solvent, and also includes a state in which a solvent has been merely volatilized without the resin composition being heated and cured. In the present embodiment, the minimum melt viscosity of the semi-cured state (B stage) is usually 1,000 Pa·s or lower. In the present embodiment, the minimum melt viscosity is measured by the following method: 1 g of a resin powder collected from the resin composition layer is used as a sample, and the minimum melt viscosity is measured using a rheometer (ARES-G2 (trade name) manufactured by TA Instruments, Inc.). Here, a disposable plate having a plate diameter of 25 mm is used, and the minimum melt viscosity of the resin powder is measured under conditions involving a temperature increase rate of 2° C./min in a range from 40° C. to 180° C., a frequency of 10.0 rad/sec, and 0.1% strain.

The resin composition layer in a semi-cured state can obtain favorable close contact between the resin composition layer and the heat-resistant film and, if a metal foil layer is disposed, favorable close contact between the resin composition layer and the metal foil layer. Furthermore, the semi-cured state improves the following property of the laminate for substrates for loading semiconductor devices and at the same time, facilitates peeling the laminate by physical force after mounting of a semiconductor device.

The difference between the maximum thickness and the minimum thickness of the first resin composition layer is usually 0.5 to 5 μm, and is preferably 0.5 to 3 μm, more preferably 0.5 to 2.5 μm, and still more preferably 0.5 to 2 μm from the viewpoint of obtaining favorable formability, less varying in forming thickness at the time of lamination, and obtaining favorable close contact between the resin composition layer and a plated layer.

In the present embodiment, the maximum thickness and the minimum thickness of the resin composition layer are values of the largest thickness and the smallest thicknesses, respectively, of the resin composition layer measured using, for example, a 450× lens of Micro-Watcher (VH-7000 (brand name) manufactured by Keyence Corp.). The difference between the maximum thickness and the minimum thickness of the resin composition layer is calculated using these values.

The thickness of the first resin composition layer can be appropriately selected depending on the thickness of an inner layer board such as a metal foil for use in lamination, the ratio of a metal to a substrate plane, and the degree of asperities of a metal foil for use in an outer layer, and is not especially limited. The thickness is usually 1 to 18 μm, more preferably 1 to 12 μm, and still more preferably 1 to 10 μm from the viewpoint of obtaining thin printed wiring boards and substrates for loading semiconductor devices. In the present embodiment, the ratio of a metal to a substrate plane (also referred to as a "residual metal rate") means Plane area of a metal disposed in a substrate/Total plane area of the substrate×100, and is usually 20 to 100%.

The first resin composition layer is not especially limited, and it is preferable to contain a thermosetting resin. The thermosetting resin is not especially limited, and can be appropriately selected from among well-known thermosetting resins (insulating materials) for use in insulating resin layers for printed wiring boards. Examples thereof include phenolic resins, epoxy resins, cyanate resins, maleimide resins (maleimide compounds), isocyanate resins, benzocyclobutene resins, bismaleimide triazine resins, and vinyl resins. These thermosetting resins may be used singly, or two or more thereof may be used as a mixture. Among these thermosetting resins, bismaleimide triazine resins, maleimide resins, epoxy resins, and cyanate resins are preferable, and maleimide resins, epoxy resins, and cyanate resins are more preferable, from the viewpoint of the heat resistance and dimensional stability of a substrate.

In the first resin composition layer according to the present embodiment, the total content of the thermosetting resin is not especially limited, and is preferably 1 to 100 parts by mass in 100 parts by mass of the resin solid content in the first resin composition layer of the present embodiment.

The phenolic resin is not especially limited, and a generally well-known phenolic resin can be used as long as having two or more hydroxy groups in one molecule. Examples thereof include bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenylaralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenolaralkyl-based phenolic resins, naphtholaralkyl-based phenolic resins, dicyclopentadiene-based phenolic resins, biphenyl-based phenolic resins, alicyclic phenolic resins, polyol-based phenolic resins, phosphorus-containing phenolic resins, and hydroxy group-containing silicone resins. These phenolic resins may be used singly, or two or more thereof may be used as a mixture.

In the first resin composition layer according to the present embodiment, the total content of the phenolic resin is not especially limited, and is preferably 1 to 20 parts by mass in 100 parts by mass of the resin solid content in the first resin composition layer of the present embodiment.

Among the thermosetting resins, the epoxy resin can suitably be used as a material for the resin composition layer because of being excellent in heat resistance, chemical resistance, and electric characteristics, and being relatively inexpensive. Examples of the epoxy resin include, but are not especially limited to, bisphenol A-based epoxy resins, bisphenol F-based epoxy resins, bisphenol S-based epoxy resins, alicyclic epoxy resins, aliphatic chain epoxy resins, phenol novolac-based epoxy resins, cresol novolac-based epoxy resins, bisphenol A novolac-based epoxy resins, diglycidyl etherification products of biphenol, diglycidyl etherification products of naphthalenediol, diglycidyl etherification products of phenols, diglycidyl etherification products of alcohols, and their alkyl substitution products, halides and hydrogenation products. Among these epoxy resins, bisphenol A-based epoxy resins, bisphenol F-based epoxy resins, phenol novolac-based epoxy resins, and cresol novolac-based epoxy resins are preferable from the viewpoint of close contact with copper. A commercially available product may be used as the epoxy resin, and, for example, Epikote® 828 (trade name) manufactured by Japan Epoxy Resins Co., Ltd., EXA830LVP (trade name) manufactured by DIC Corp., DEN438 (trade name) manufactured by The Dow Chemical Company, and ESCN220F (trade name) manufactured by Sumitomo Chemical Industry Co., Ltd. can be used. These epoxy resins may be used singly, or two or more thereof may be used as a mixture.

A curing agent that is used together with this epoxy resin is not especially limited, and a well-known curing agent can be used as long as curing the epoxy resin. Examples of the curing agent include polyfunctional phenols, polyfunctional alcohols, amines, imidazole compounds, acid anhydrides, and organic phosphorus compounds, and their halides. These curing agents may be used singly, or two or more thereof may be used as a mixture.

In the first resin composition layer according to the present embodiment, the total content of the epoxy resin is not especially limited, and is preferably 20 to 80 parts by mass in 100 parts by mass of the resin solid content in the first resin composition layer of the present embodiment.

The cyanate resin is a resin that is heated to thereby form a cured product having a triazine ring as a repeat unit, and the cured product is excellent in dielectric characteristics. Hence, the cyanate resin is suitable, particularly, when high-frequency characteristics are required, for example. Examples of the cyanate resin include, but are not especially limited to, 2,2'-bis(4-cyanatephenyl)propane, bis(4-cyanatephenyl)methane, bis(4-cyanatephenyl)ethane, 1,3-dicyanatebenzene, 1,4-dicyanatebenzene, 1,3,5-tricyanatebenzene, 1,3-dicyanatenaphthalene, 1,4-dicyanatenaphthalene, 1,6-dicyanatenaphthalene, 1,8-dicyanatenaphthalene, 2,6-dicyanatenaphthalene, 2, 7-dicyanatenaphthalene, 1,3,6-tricyanatenaphthalene, 4, 4'-dicyanatebiphenyl, bis(4-cyanatephenyl) ether, 2, 2'-bis(4-cyanatephenyl)propane, 2,2'-bis(3, 5-dimethyl-4-cyanatephenyl)methane, 2,2'-(4-cyanatephenyl)-1,1',1",3,3',3"-hexafluoropropane, bis(4-cyanatephenyl)thioether, bis(4-cyanatephenyl)sulfone, α,α'-bis(4-cyanatephenyl)-m-diisopropylbenzene, naphtholaralkyl-based cyanate compounds represented by the formula (1) given below, novolac-based cyanate compounds represented by the formula (2) given below, and biphenylaralkyl-based cyanate compounds, and cyanate esterification products of phenol novolac and alkylphenol novolac. These cyanate resins may be used singly, or two or more thereof may be used as a mixture. Cyanate ester compounds may be partially oligomerized into trimers or pentamers in advance or may be prepolymers. The prepolymer is not especially limited, and it is preferable to have a mass-average molecular weight in the range of 500 to 4,000 based on polystyrene in gel permeation chromatography (GPC).

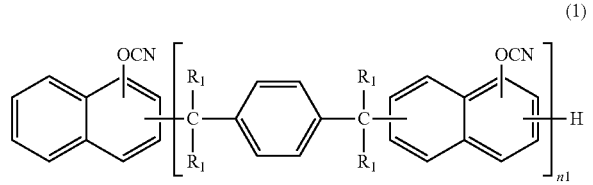

(1)

In the formula (1), each $R_1$ independently represents a hydrogen atom or a methyl group and is preferably a hydrogen atom. In the formula (1), n1 represents an integer of 1 or larger. The upper limit value of n1 is not especially limited and is usually 10 and preferably 6.

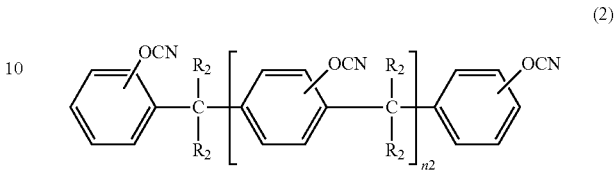

(2)

In the formula (2), each $R_2$ independently represents a hydrogen atom or a methyl group and is preferably a hydrogen atom. In the formula (2), n2 represents an integer of 1 or larger. The upper limit value of n2 is not especially limited and is usually 10 and preferably 7.

Among these cyanate resins, 2,2-bis(4-cyanatephenyl) propane and prepolymers of this cyanate ester compound are preferable because of having more favorable balance between the dielectric characteristics and curability of cured products and being inexpensive in terms of cost.

In the first resin composition layer according to the present embodiment, the total content of the cyanate resin is not especially limited, and is preferably 20 to 80 parts by mass in 100 parts by mass of the resin solid content in the first resin composition layer of the present embodiment.

In the present embodiment, the cyanate resin may be used in combination with a curing catalyst and a curing accelerator.

The curing catalyst is not especially limited, and, for example, metals of manganese, iron, cobalt, nickel, copper, and zinc can be used. Specific examples thereof include: organic metal salts such as 2-ethylhexanoate and octylate; and organic metal complexes such as acetyl acetone iron. These curing catalysts may be used singly, or two or more thereof may be used as a mixture.

The curing accelerator is not especially limited, and it is preferable to use phenols. Examples of the phenol include: monofunctional phenols such as nonylphenol and p-cumylphenol; difunctional phenols such as bisphenol A, bisphenol F, and bisphenol S; and polyfunctional phenols such as phenol novolac and cresol novolac. These curing accelerators may be used singly, or two or more thereof may be used as a mixture.

In the first resin composition layer according to the present embodiment, the contents of the curing catalyst and the curing accelerator are not especially limited, and are each preferably 0.01 to 10 parts by mass in 100 parts by mass of the resin solid content in the first resin composition layer of the present embodiment.

The maleimide resin or the maleimide compound is not especially limited, and a generally well-known resin or compound can be used as long as having one or more maleimide groups in one molecule. Examples thereof include N-phenylmaleimide, N-hydroxyphenylmaleimide, bis(4-maleimidophenyl)methane, 4,4'-diphenylmethane bismaleimide, phenylmethane maleimide, m-phenylene bismaleimide, 2,2'-bis(4-(4-maleimidophenoxy)-phenyl)propane, bis(3,5-dimethyl-4-maleimidophenyl)methane, bis(3-ethyl-5-methyl-4-maleimidophenyl)methane, bis(3,5-diethyl-4-maleimidophenyl)methane, 3,3'-dimethyl-5,5'-diethyl-4,4'-diphenylmethane bismaleimide, 4-methyl-1,3-phenylene bismaleimide, 1,6-bismaleimide-(2,2',4-trimethyl)hexane, 4,4'-diphenyl ether bismaleimide, 4,4'-diphenylsulfone bismaleimide, 1,3-bis(3-maleimidophenoxy)benzene, 1,3-bis(4-maleimidophenoxy)benzene, polyphenylmethane maleimide, maleimide compounds represented by the following formula (3), novolac-based maleimide, biphenylaralkyl-based maleimide, and prepolymers of these maleimide compounds, and prepolymers of these maleimide compounds and amine compounds. These maleimide resins (maleimide compounds) may be used singly, or two or more thereof may be used as a mixture.

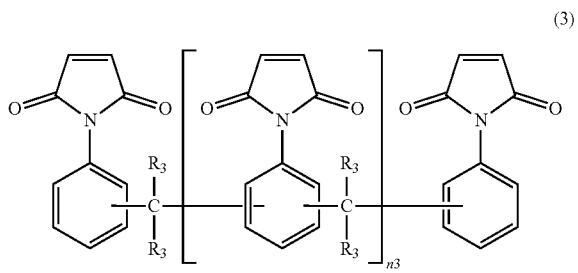

(3)

In the formula (3), $R_3$ represents a hydrogen atom or a methyl group and is preferably a hydrogen atom. In the formula (3), n3 represents an integer of 1 or larger. The upper limit value of n3 is not especially limited and is usually 10 and preferably 7.

In the first resin composition layer according to the present embodiment, the total content of the maleimide resin and the maleimide compound is not especially limited, and is preferably 1 to 30 parts by mass in 100 parts by mass of the resin solid content in the first resin composition layer of the present embodiment.

Examples of the isocyanate resin include, but are not especially limited to, isocyanate resins obtained through dehydrohalogenation reaction of phenols with cyanogen halide. Examples of the isocyanate resin include 4,4'-diphenylmethane diisocyanate MDI, polymethylene polyphenyl polyisocyanate, tolylene diisocyanate, and hexamethylene diisocyanate. These isocyanate resins may be used singly, or two or more thereof may be used as a mixture.

In the first resin composition layer according to the present embodiment, the total content of the isocyanate resin is not especially limited, and is preferably 1 to 10 parts by mass in 100 parts by mass of the resin solid content in the first resin composition layer of the present embodiment.

The benzocyclobutene resin is not especially limited as long as the resin contains a cyclobutene skeleton. For example, divinylsiloxane-bisbenzocyclobutene (manufactured by The Dow Chemical Company) can be used. These benzocyclobutene resins may be used singly, or two or more thereof may be used as a mixture.

In the first resin composition layer according to the present embodiment, the total content of the benzocyclobutene resin is not especially limited, and is preferably 1 to 10 parts by mass in 100 parts by mass of the resin solid content in the first resin composition layer of the present embodiment.

Examples of the BT resin include, but are not especially limited to, polymers obtained by dissolving cyanate compounds and maleimide compounds without solvents or in organic solvents such as methyl ethyl ketone, N-methylpyrrolidone, dimethylformamide, dimethylacetamide, toluene, and xylene, followed by heating and mixing.

Examples of the cyanate compound for use as a raw material of the BT resin include, but are not especially limited to, naphtholaralkyl-based cyanate compounds represented by the formula (1), novolac-based cyanate compounds represented by the formula (2), biphenylaralkyl-based cyanate compounds, 2,2'-bis(3,5-dimethyl-4-cyanatephenyl)methane, bis(4-cyanatephenyl)methane, 1,3-dicyanatebenzene, 1,4-dicyanatebenzene, 1,3,5-tricyanatebenzene, 1,3-dicyanatenaphthalene, 1,4-dicyanatenaphthalene, 1,6-dicyanatenaphthalene, 1,8-dicyanatenaphthalene, 2,6-dicyanatenaphthalene, 2,7-dicyanatenaphthalene, 1,3,6-tricyanatenaphthalene, 4,4'-dicyanatebiphenyl, bis(4-cyanatephenyl) ether, bis(4-cyanatephenyl)thioether, bis(4-cyanatephenyl)sulfone, and 2,2'-bis(4-cyanatephenyl)propane. Among them, naphtholaralkyl-based cyanate compounds represented by the formula (1), novolac-based cyanate compounds represented by the formula (2), and biphenylaralkyl-based cyanate compounds are preferable because there is a tendency to further improve flame retardancy and curability and to further decrease thermal expansion coefficients.

Examples of the maleimide compound for use as a raw material of the BT resin include, but are not especially limited to, N-phenylmaleimide, N-hydroxyphenylmaleimide, bis(4-maleimidophenyl)methane, 2,2-bis(4-(4-maleimidophenoxy)-phenyl)propane, bis(3,5-dimethyl-4-maleimidophenyl)methane, bis(3-ethyl-5-methyl-4-maleimidophenyl)methane, bis(3,5-diethyl-4-maleimidophenyl)methane, maleimide compounds represented by the formula (3), and prepolymers of these maleimide compounds, and prepolymers of these maleimide compounds and amine compounds. Among them, bis(4-maleimidophenyl)methane, 2,2-bis(4-(4-maleimidophenoxy)-phenyl)propane, bis(3-ethyl-5-methyl-4-maleimidophenyl)methane, and maleimide compounds represented by the formula (3) are preferable.

The ratio of the maleimide compound for use as a raw material of the BT resin is not especially limited, and is preferably 5 to 75 parts by mass based on 100 parts by mass in total of the BT resin from the viewpoint of glass transition temperature, flame retardancy, and curability. The number-average molecular weight of the prepolymer BT resin is not especially limited, and is preferably 100 to 100,000 based on polystyrene in gel permeation chromatography (GPC) from the viewpoint of handleability, glass transition temperature, and curability.

In the first resin composition layer according to the present embodiment, the total content of the BT resin is not especially limited, and is preferably 10 to 70 parts by mass in 100 parts by mass of the resin solid content in the first resin composition layer of the present embodiment.

Examples of the vinyl resin include, but are not especially limited to, polymers and copolymers of vinyl monomers. Examples of the vinyl monomer include, but are not especially limited to, (meth)acrylic acid ester derivatives, vinyl ester derivatives, maleic acid diester derivatives, (meth)acrylamide derivatives, styrene derivatives, vinyl ether derivatives, vinyl ketone derivatives, olefin derivatives, maleimide derivatives, and (meth)acrylonitrile. These vinyl resins may be used singly, or two or more thereof may be used as a mixture.

A thermoplastic resin may be blended into the resin composition layer in consideration of dielectric characteristics, impact resistance, and film processability, etc. Examples of the thermoplastic resin include, but are not especially limited to, fluororesin, polyphenylene ether, modified polyphenylene ether, polyphenylene sulfide, polycarbonate, polyetherimide, polyether ether ketone, poly(meth)acrylate, polyamide, polyamide imide, and polybutadiene. These thermoplastic resins may be used singly, or two or more thereof may be used as a mixture.

Examples of the fluororesin include, but are not especially limited to, polytetrafluoroethylene, polychlorotrifluoroethylene, polyvinylidene fluoride, and polyvinyl fluoride. These fluororesins may be used singly, or two or more thereof may be used as a mixture.

Among the thermoplastic resins, polyphenylene ether and/or modified polyphenylene ether used by blending is useful from the viewpoint of being able to improve the dielectric characteristics of cured products. Examples of the polyphenylene ether and the modified polyphenylene ether include, but are not especially limited to, poly(2,6-dimethyl-1,4-phenylene) ether, alloyed polymers of poly(2,6-dimethyl-1,4-phenylene) ether and polystyrene, alloyed polymers of poly(2,6-dimethyl-1,4-phenylene) ether and a styrene-butadiene copolymer, alloyed polymers of poly(2,6-dimethyl-1,4-phenylene) ether and a styrene-maleic anhydride copolymer, alloyed polymers of poly(3,6-dimethyl-1,4-phenylene) ether and polyamide, and alloyed polymers of poly(2,6-dimethyl-1,4-phenylene) ether and a styrene-butadiene-(meth)acrylonitrile copolymer. These polyphenylene ethers and modified polyphenylene ethers may be used singly, or two or more thereof may be used as a mixture. In order to impart reactivity or polymerizability to polyphenylene ether, functional groups such as an amine group, an epoxy group, a carboxy group, and a styryl group may be introduced to polymer chain ends, or functional groups such as an amine group, an epoxy group, a carboxyl group, a styryl group, and a methacryl group may be introduced to polymer chain side chains.

The polyphenylene sulfide is a polymer of aromatic rings through sulfide bonds. Examples thereof can include branched or linear polyphenylene sulfide, and copolymers thereof. Examples thereof include p-phenylene sulfide and m-phenylene sulfide, and their polymers, and copolymers having an ether unit, a sulfone unit, a biphenyl unit, a naphthyl unit, a substituted phenyl sulfide unit, and a trifunctional phenyl sulfide unit copolymerizable therewith in the molecule. These polyphenylene sulfides may be used singly, or two or more thereof may be used as a mixture.

Examples of the polycarbonate include, but are not especially limited to, brominated polycarbonate oligomers. The molecular weight of the brominated polycarbonate oligomer is not especially limited, and is preferably a mass-average molecular weight of 500 to 3,500 based on polystyrene in gel permeation chromatography (GPC).

Examples of the polyetherimide include, but are not especially limited to, condensates of 2,2'-bis[4-(2,3-dicarboxyphenoxy)phenyl]propane dianhydride and m-phenylenediamine or p-phenylenediamine, and their copolymers and modified products. These polyetherimides may be used singly, or two or more thereof may be used as a mixture. A commercially available product may be used as the polyetherimide. Examples thereof include Ultem® 1000 series (trade name), 5000 series (trade name), and 6000 series (trade name) manufactured by GE Plastics.

Examples of the polyether ether ketone include, but are not especially limited to, copolymers of 4,4'-difluorobenzophenone and hydroquinone. These polyether ether ketones may be used singly, or two or more thereof may be used as a mixture.

Examples of the poly(meth)acrylate include, but are not especially limited to, tris(2-(meth)acryloyloxyethyl) isocyanurate. These poly(meth)acrylates may be used singly, or two or more thereof may be used as a mixture.

Examples of the polyamide include, but are not especially limited to, polyamide 12, polyamide 11, polyamide 6, polyamide 6,6, and polyamide 6,12 copolymers. These polyamides may be used singly, or two or more thereof may be used as a mixture.

Among the thermoplastic resins, the polyamide imide resin is useful from the viewpoint of being excellent in moisture resistance and having a favorable adherence property to metals. The raw material of the polyamide imide resin is not especially limited. Examples of acid components include trimellitic anhydride and trimellitic anhydride monochloride. Examples of amine components include, but are not especially limited to, m-phenylenediamine, p-phenylenediamine, 4,4'-diaminodiphenyl ether, 4,4'-diaminodiphenylmethane, bis[4-(aminophenoxy)phenyl]sulfone, and 2,2'-bis[4-(4-aminophenoxy)phenyl]propane. The polyamide imide resin may be siloxane-modified in order to improve a drying property. In this case, siloxanediamine can be used as an amino component. It is preferable to use a polyamide imide resin having a mass-average molecular weight of 50000 or larger based on polystyrene in gel permeation chromatography (GPC), in consideration of film processability. These polyamide imide resins may be used singly, or two or more thereof may be used as a mixture.

Examples of the polybutadiene include, but are not especially limited to, 1,4-polybutadiene, 1,2-polybutadiene, terminally (meth)acrylate-modified polybutadiene, and terminally urethane methacrylate-modified polybutadiene. These polybutadienes may be used singly, or two or more thereof may be used as a mixture.

Fillers such as an inorganic fillers and organic fillers may be mixed into the resin composition layer without impairing the characteristics of the present embodiment. Examples of the inorganic filler include, but are not especially limited to, alumina, aluminum hydroxide, magnesium hydroxide, clay, talc, antimony trioxide, antimony pentoxide, zinc oxide, fused silica, glass powders, quartz powders, and Shirasu balloons. Examples of the organic filler include, but are not especially limited to, diallyl phthalate prepolymers and diallyl isophthalate prepolymers. These fillers may be used singly, or two or more thereof may be used as a mixture.

The content of the filler is not especially limited, and is preferably 1 to 500 parts by mass based on 100 parts by mass of the resin solid content in the first resin composition layer.

An organic solvent may remain in the resin composition layer. The organic solvent is usually derived from an organic solvent (varnish) used for forming the resin composition layer. Examples of the organic solvent include, but are not especially limited to: aromatic hydrocarbon solvents of benzene, toluene, xylene, and trimethylbenzene; ketone solvents of acetone, methyl ethyl ketone, and methyl isobutyl ketone; ether solvents of tetrahydrofuran; alcohol solvents of isopropanol and butanol; ether alcohol solvents of 2-methoxyethanol and 2-butoxyethanol; and amide solvents of N-methylpyrrolidone, N,N'-dimethylformamide, and N,N'-dimethylacetamide. These organic solvents may be used singly, or two or more thereof may be used as a mixture. In the case of fabricating the resin composition layer, the amount of the solvent in the varnish is not especially limited, and is preferably in the range of 40 to 400% by mass and more preferably in the range of 60 to 180% by mass based on 100% by mass of the varnish. Since the amount of a coating film can be accurately adjusted by controlling the amount of the solvent in the varnish to within the above range, the difference between the maximum thickness and the minimum thickness of the resin composition layer can suitably be controlled so that a resin composition layer having a uniform film thickness can be obtained. If the amount of the solvent in the varnish is less than 40% by mass, there is a tendency to fail to coat the heat-resistant film layer with the varnish without any space even if the varnish has a suitable viscosity. If the amount of the solvent in the varnish exceeds 400% by mass, there is a tendency to fail to obtain a suitable varnish viscosity.

The resin composition layer can further be supplemented, if necessary, with various additives such as flame retardants, curing agents, curing accelerators, thermoplastic particles, colorants, ultraviolet-opaque agents, antioxidants, and reducing agents that are not listed above, without impairing the characteristics of the present embodiment. These additives may be used singly, or two or more thereof may be used as a mixture.

Examples of the flame retardant include, but are not especially limited to: bromine compounds such as decabromodiphenyl ether, tetrabromobisphenol A, tetrabromophthalic anhydride, and tribromophenol; phosphorus compounds such as triphenyl phosphate, trixylyl phosphate, and cresyl diphenyl phosphate; metal hydroxides such as magnesium hydroxide and aluminum hydroxide; red phosphorus and modified products thereof; antimony compounds such as antimony trioxide and antimony pentoxide; and triazine compounds such as melamine, cyanuric acid, and melamine cyanurate. These flame retardants may be used singly, or two or more thereof may be used as a mixture.

In the first resin composition layer according to the present embodiment, the contents of the additives are not especially limited, and are each preferably 0.1 to 10 parts by mass in 100 parts by mass of the resin solid content in the first resin composition layer of the present embodiment.

<Second Resin Composition Layer>

The second resin composition layer is not especially limited as long as the second resin composition layer is in a semi-cured state (B stage) and the difference between the maximum thickness and the minimum thickness of the second resin composition layer is 0.5 to 5 µm. The semi-cured state (B stage) is as described above.

The difference between the maximum thickness and the minimum thickness of the second resin composition layer is usually 0.5 to 5 µm, and is preferably 0.5 to 3 µm, more preferably 0.5 to 2.5 µm, and still more preferably 0.5 to 2 µm from the viewpoint of obtaining favorable formability, less varying in forming thickness at the time of lamination, and obtaining favorable close contact between the resin composition layer and a plated layer. The difference between the maximum thickness and the minimum thickness of the second resin composition layer may be the same as or different from that of the first resin composition layer, and is preferably the same as that of the first resin composition layer from the viewpoint of productivity, and from the viewpoint that the second resin composition layer having the desired difference between the maximum thickness and the minimum thickness might not be obtained due to contamination of the varnish used in formation of the second resin composition layer by the varnish used in formation of the first resin composition layer. The maximum thickness and the minimum thickness of the resin composition layer are, as described above, values measured using, for example, Micro-Watcher, and the difference between the maximum thickness and the minimum thickness is a value calculated using these values.

The thickness of the second resin composition layer can be appropriately selected depending on the thickness of an inner layer board such as a metal foil for use in lamination, the ratio of a metal to a substrate plane, and the degree of asperities of a metal foil for use in an outer layer, and is not especially limited. The thickness is usually 1 to 18 µm, preferably 1 to 12 µm, and more preferably 1 to 10 µm from the viewpoint of obtaining thin printed wiring boards and substrates for loading semiconductor devices. The thickness of the second resin composition layer may be the same as or different from that of the first resin composition layer, and is preferably the same as that of the first resin composition layer from the viewpoint of productivity, and from the viewpoint that the second resin composition layer having the desired difference between the maximum thickness and the minimum thickness might not be obtained due to contamination of the varnish used in formation of the second resin composition layer by the varnish used in formation of the first resin composition layer.

The second resin composition layer is not especially limited, and it is preferable to contain a thermosetting resin. The thermosetting resin is not especially limited, and can be appropriately selected from among well-known thermosetting resins (insulating materials) for use in printed wiring boards. Examples thereof include phenolic resins, epoxy resins, cyanate resins, maleimide resins (maleimide compounds), isocyanate resins, benzocyclobutene resins, bismaleimide triazine resins, and vinyl resins. These thermosetting resins may be used singly, or two or more thereof may be used as a mixture. Among these thermosetting resins, bismaleimide triazine resins, maleimide resins, epoxy resins, and cyanate resins are preferable, and maleimide resins, epoxy resins, and cyanate resins are more preferable, from the viewpoint of the heat resistance and dimensional stability of a substrate. Specific examples thereof, also including the amount of such a resin blended, are the same as those for the first resin composition layer. The total content of the thermosetting resin is not especially limited, and is preferably 1 to 100 parts by mass in 100 parts by mass of the resin solid content in the second resin composition layer.

Components contained in the second resin composition layer, and the amounts of the components blended may be the same as or different from those of the first resin composition layer, and are preferably the same as those of the first resin composition layer from the viewpoint of productivity, and from the viewpoint that the second resin composition layer having the desired difference between the maximum thickness and the minimum thickness might not be obtained due to contamination of the varnish used in formation of the second resin composition layer by the varnish used in formation of the first resin composition layer. That is, it is preferable to produce the second resin composition layer using the same components as those of the first resin composition layer. Specific examples of the components contained in the second resin composition layer are the same as those for the first resin composition layer.

[Method for Producing Laminate]

The laminate of the present embodiment can be produced by a well-known method, which is not especially limited.

For example, in order to form the first and second resin composition layers of the present embodiment, the components of each layer described above are sequentially blended into a solvent and thoroughly stirred, and the obtained resin composition can be used in production. The resin composition used in the present embodiment can suitably be used as a varnish in fabricating the resin composition layer of the present embodiment. If necessary, resin compositions (varnishes) may be fabricated in advance separately using the components described above, and mixed to thereby fabricate a varnish for use in fabricating the resin composition layer of the present embodiment.

In production of the resin composition, if necessary, a well-known treatment (e.g., stirring, mixing, and kneading treatments) for uniformly dissolving or dispersing each component can be performed. For example, in the case of using a filler, the dispersibility of the filler in the resin composition can be improved by performing stirring and dispersion treatment using a stirring vessel equipped with a stirrer having a proper stirring capacity. The stirring, mixing, and kneading treatments described above can be appropriately performed using well-known apparatuses, for example, a stirring apparatus aimed at dispersion, such as an ultrasonic homogenizer, an apparatus aimed at mixing, such as three rolls, a ball mill, a bead mill, and a sand mill, and a revolution or rotation mixing apparatus. In preparation of the resin composition of the present embodiment, if necessary, an organic solvent can be used. The organic solvent is not especially limited by its type as long as being capable of dissolving a resin in the resin composition. Specific examples thereof are as described above.

Subsequently, in a method for laminating the resin composition layer onto the heat-resistant film layer, the resin composition is dissolved in an organic solvent to prepare a varnish; a heat-resistant film is coated with this varnish using bar coating, spin coating, blade coating, reverse coating, spray coating, roll coating, gravure coating, lip coating, air knife coating, and dipping, etc.; and the organic solvent can be dried by heating or hot air blowing, etc. to thereby form and produce a resin composition layer in a semi-cured state (B stage) having a specific range of the difference between the maximum thickness and the minimum thickness of the resin composition layer. In the present embodiment, the amount of the solvent in the varnish is not especially limited, and is preferably in the above range because the amount of a coating film can be accurately adjusted and the difference between the maximum thickness and the minimum thickness of the resin composition layer can suitably be controlled so that a resin composition layer having a uniform film thickness can be obtained.

The residual amount of the organic solvent in the resin composition layer is preferably 5 parts by mass or less and more preferably 3 parts by mass or less based on 100 parts by mass in total of the resin composition layer from the viewpoint of preventing diffusion of the organic solvent in a later step. The lower limit is not especially limited, and it is preferable that no organic solvent should remain. The lower limit is usually 0 parts by mass. The organic solvent for preparing the varnish is not especially limited as long as being able to suitably dissolve or disperse each component for the resin composition. Specific examples of the organic solvent are as described above.

In the present embodiment, after the first resin composition layer is laminated onto the heat-resistant film layer using the varnish, the second resin composition layer may be laminated onto a surface of the heat-resistant film layer on which the first resin composition layer is not laminated, using the varnish. Alternatively, the first resin composition layer and the second resin composition layer may be laminated onto both surfaces of the heat-resistant film layer at the same time using the varnishes. The varnishes for use in the first and second resin composition layers may be the same or different, and are preferably the same from the viewpoint of productivity, and from the viewpoint that a resin composition layer having the desired difference between the maximum thickness and the minimum thickness might not be obtained due to mixing of the varnish used in formation of the first resin composition layer with the varnish used in formation of the second resin composition layer.

In the present embodiment, it is preferable to use gravure coating from the viewpoint of being able to suitably control the difference between the maximum thickness and the minimum thickness of the resin composition layer. An apparatus for use in the gravure coating is not especially limited as long as being able to form the first and second resin composition layers having a uniform film thickness on both surfaces of the heat-resistant film layer. Examples thereof include 120R-75 (trade name) manufactured by Techno Smart Corp.

In the case of laminating the resin composition layer onto the heat-resistant film layer by gravure coating, it is preferable to prepare a varnish such that a coating liquid (varnish) flows smoothly without any space on the heat-resistant film layer, from the viewpoint of controlling the difference between the maximum thickness and the minimum thickness of the resin composition layer. From such a viewpoint, the amount of the solvent in the varnish is not especially limited, and is preferably in the above range because the amount of a coating film can be accurately adjusted and the difference between the maximum thickness and the minimum thickness of the resin composition layer can suitably be controlled so that a resin composition layer having a uniform film thickness can be obtained. The viscosity of the varnish is preferably 1 to 500 mPa·s and more preferably 10 to 300 mPa·s, and is still more preferably 20 to 70 mPa·s from the viewpoint of being able to obtain a suitable varnish with which the heat-resistant film layer can be coated without any space. In the gravure coating, the heat-resistant film layer is coated with the resin composition layer using a gravure roll. When the amount of the solvent in the varnish and the viscosity of the varnish fall within the above respective ranges, asperities, such as voids, which occur locally, can be reduced and the amount of a coating film of the resin composition layer can be accurately adjusted. Hence, the difference between the maximum thickness and the minimum thickness of the resin composition layer can suitably be controlled so that a resin composition layer having a uniform film thickness can be obtained. It is preferable to use a film having a smooth surface as the heat-resistant film, and it is more preferable to use a film of a polyimide resin and a film of a polyamide resin from the viewpoint of heat resistance.

The rotational speed of the gravure roll is usually 1 to 30 m/s, and is preferably 3 to 10 m/s from the viewpoint of formability. In this respect, the traveling speed of the heat-resistant film is usually 1 to 30 m/s, and is preferably 3 to 10 m/s from the viewpoint of formability.

The ratio of rotational speed G (m/s) of the gravure roll to traveling speed S (m/s) of the heat-resistant film (G/S) is not especially limited, and is preferably 0.5 to 2.0. Thereby, the first and second resin composition layers having a very small film thickness, preferably a film thickness of 1 to 10 μm, can be obtained while their film thicknesses are controlled. The ratio (G/S) is more preferably 0.8 to 1.5 from the viewpoint of improvement in workability and production efficiency.

The traveling speed S of the heat-resistant film is not especially limited, and is preferably 1 to 30 m/s from the viewpoint of formability and more preferably 3 to 10 m/s from the viewpoint of the uniformity of the film thicknesses of the first and second resin composition layers and production efficiency.

In the gravure coating, the uniformity of a film thickness in the continuous length direction and the uniformity of a film thickness in the width direction may be of concern. Hence, the uniformity of the film thickness in the continuous length direction is not especially limited, and is controlled to preferably within 30% and more preferably within 20%. The uniformity of the film thickness in the width direction is not especially limited, and is controlled to preferably within 30% and more preferably within 20%. In the present embodiment, the uniformity of the film thickness in the continuous length direction and the uniformity of the film thickness in the width direction refer to values (%) of standard deviation with respect to mean, i.e., (Standard deviation/Mean)×100 (%).

The heating and drying step after coating of the heat-resistant film with the resin composition layer is not especially limited, and can be performed by, for example, a method involving heating for 1 to 60 minutes in a dryer of 60 to 100° C. In the present embodiment, a resin composition layer in a semi-cured state can be obtained through the heating and drying step.

<Protective Film>

The laminate of the present embodiment may contain a protective film in order to protect the first and second resin composition layers formed on the heat-resistant film layer. The protective film can protect the resin composition layer by keeping dust or garbage off in the course of distribution of the laminate before lamination onto circuit substrates, while protecting the surface of the resin composition layer against physical damage. Examples of such a protective film can include films of polyolefins such as polyethylene, polypropylene, and polyvinyl chloride; polyesters such as PET (polyethylene terephthalate) and PEN (polyethylene naphthalate); PC (polycarbonate); and polyimide. The protective film may be subjected to mud treatment and corona treatment as well as mold release treatment. The thickness of the protective film is not especially limited, and is in the range of, for example, 5 to 30 μm. The protective film may be colored or may provide a description stating that it is a protective film. For a method for laminating the protective film, see, for example, a lamination method described about a metal foil-clad laminate mentioned later.

[Metal Foil-Clad Laminate]

The metal foil-clad laminate of the present embodiment has the laminate of the present embodiment, and a metal foil disposed on one surface or both surfaces of this laminate. In the present embodiment, the metal foil can be laminated onto a surface of the first resin composition layer and/or the second resin composition layer, and pressurized in the lamination direction of the laminate under heating to thereby obtain a metal foil-clad laminate. A high-strength and thin metal foil-clad laminate can be obtained by using the laminate of the present embodiment.

Examples of the metal foil include, but are not especially limited to, gold, silver, copper and aluminum and alloys composed of two or more metals thereof. The metal foil is preferably copper from the viewpoint of electroconductivity. The metal foils to be laminated onto the first resin composition layer and the second resin composition layer may be the same or different, and preferably the same. The thicknesses of the metal foils are each not especially limited, and are each usually 1 to 18 μm and are each preferably 1 to 15 μm and more preferably 1 to 12 μm from the viewpoint of ease of laser drilling. The thicknesses of the metal foils may be the same or different, and are preferably the same.

Commercially available products, for example, GHY5 (trade name, 12 μm-thick copper foil) manufactured by JX Nippon Mining & Metals Corp., and 3EC-VLP (trade name, 12 μm-thick copper foil) and 3EC-III (trade name, 18 μm-thick copper foil) manufactured by Mitsui Mining & Smelting Co., Ltd may be used as the metal foil. An adhesive resin layer may further be provided between the metal foil and each resin composition layer to adhere them, or a metal foil with an adhesive resin layer may be used. The material of the adhesive resin layer is not especially limited, and, for example, acrylic resins, epoxy resins, polyimide resins, and polyester resins can be used.

Examples of a method for the heating and pressurizing treatment can include, but are not especially limited to, vacuum (reduced pressure) hot pressing and vacuum (reduced pressure) lamination. Among them, vacuum (reduced pressure) hot pressing is preferable because adhesive strength can be more raised.

The heating temperature is not especially limited, and is preferably 180 to 230° C. and more preferably 190 to 220° C. When the heating temperature is in the above range, the adhesion of the first resin composition layer, the heat-resistant film layer, and the second resin composition layer can be carried out more sufficiently.

The pressurizing pressure is not especially limited, and is preferably 1 to 4 MPa and more preferably 2.5 to 3.5 MPa. When the pressurizing pressure is in the above range, the adhesion of the first resin composition layer, the heat-resistant film layer, and the second resin composition layer can be carried out more sufficiently.

The time of the heating and pressurizing is not especially limited, and is preferably 30 to 300 minutes and more preferably 40 to 120 minutes. When the time of the heating and pressurizing is in the above range, the adhesion of the first resin composition layer, the heat-resistant film layer, and the second resin composition layer can be carried out more sufficiently.

[Laminate Having Patterned Metal Foil]

The laminate having a patterned metal foil according to the present embodiment has the laminate of the present embodiment, and a patterned metal foil disposed on one surface or both surfaces of this laminate. In the present embodiment, the laminate having a patterned metal foil can be obtained by appropriately masking and patterning a metal foil in a copper foil-clad laminate. The masking and the patterning can use well-known masking and patterning carried out in production of printed wiring boards, and are not especially limited, and it is preferable to carry out patterning (to form circuit patterns) by a subtractive process. The metal foil is as described above.

The masking and patterning by the subtractive process can be carried out, for example, as follows: on the whole surface of the metal foil, a photosensitive dry film resist (for example, RD-1225 (trade name) manufactured by Hitachi Chemical Co., Ltd.) was laminated at a temperature of 110±10° C. and a pressure of 0.50±0.02 MPa. Then, exposure is carried out according to a predetermined circuit pattern of the metal foil for masking. Thereafter, the dry film resist of both the surfaces is subjected to a development treatment with an aqueous solution of 1% by mass of sodium carbonate, and portions of the metal foil which are not covered with the etching resist are removed with a cupric chloride aqueous solution; and finally, the dry film resist is stripped in an amine-based resist stripping solution (e.g., Clean Etch® EF-105A R-100 (trade name) manufactured by Ryoko Chemical Co., Ltd.). Thereby, the laminate having a patterned metal foil can be formed.

[Laminate Having Buildup Structure]

The laminate of the present embodiment can be used in, for example, a laminate having a buildup structure for printed wiring boards, multilayer coreless substrates, and substrates for loading semiconductor devices. The laminate having a buildup structure has, for example, a structure containing the laminate of the present embodiment and a conductor layer alternately laminated. The laminate having a buildup structure contains the laminate of the present embodiment and a conductor layer alternately laminated, and can be produced by a method containing one or two or more steps of pressurizing them in the lamination direction thereof under heating. The conductor layer is not especially limited, and, for example, the metal foil described above can be used. A circuit pattern may be formed on the conductor layer by appropriately masking and patterning the metal foil. For a method for the masking and the patterning, see the description above.

Also, the laminate having a buildup structure may be produced by a method containing one or two or more steps of further laminating a metal foil (conductor layer) and an insulating resin layer on one surface or both surfaces of the laminate of the present embodiment, and pressurizing them in the lamination direction thereof under heating. That is, the laminate having a buildup structure may be fabricated by repeating the step at least once or more. The order of lamination of the conductor layer and the insulating resin layer is not especially limited. The laminate having a buildup structure has a plurality of conductor layers and insulating resin layers, and can be configured such that the conductor layer is disposed between the insulating resin layers and on the surface of the outermost layer of the buildup structure. In this respect, the number of insulating resin layers is not especially limited, and can be, for example, 3 or 4. The insulating material that can be used in the insulating resin layer of the laminate having a buildup structure is not especially limited, and a well-known insulating material can be used. Such an insulating material may be, for example, a resin composition containing the thermosetting resin for use in the first resin composition layer and the second resin composition layer, or may be a prepreg. The prepreg refers to a material in which a resin composition is added and adhered to a fibrous reinforcing material such as glass fibers or organic fibers. Although the metal foil is not especially limited, see, for example, the metal foil described above. Although the conductor layer is not especially limited, see, for example, the conductor layer described above.

The laminate of the present embodiment may be used, for example, for the purpose of fabricating a coreless substrate for a buildup material for printed wiring boards, multilayer coreless substrates, and substrates for loading semiconductor devices. Examples of the coreless substrate include 2-layer or more coreless substrates, for example, 3-layer coreless substrates. The configuration of the coreless substrate will be mentioned later.

For the laminate having a buildup structure, it is preferable that the thickness of at least one insulating resin layer should be 4 to 15 μm, from the viewpoint of achieving demands for thinner films. The thickness of the insulating resin layer differs depending on various applications of the laminate, and is more preferably, for example, 6 to 14 μm and still more preferably 8 to 12 μm.

Although a method for the heating and pressurizing treatment, the heating temperature, the pressurizing pressure, and the time of the heating and pressurizing treatment in producing the laminate having a buildup structure are not especially limited, see, for example, the method for the heating and pressurizing treatment, the heating temperature, the pressurizing pressure, and the time of the heating and pressurizing treatment described above about the metal foil-clad laminate.

[Printed Wiring Board]

The laminate of the present embodiment can suitably be used in the application of printed wiring boards. The printed wiring board of the present embodiment contains the laminate of the present embodiment, and can usually be obtained by using the laminate of the present embodiment as a buildup material for a metal foil-clad laminate having a completely cured insulating resin layer called core base material. A high-strength and thin printed wiring board in which high-density fine wiring is formed can be produced by using the laminate of the present embodiment, without using, for example, thick support substrates (carrier substrates). The printed wiring board obtained using the laminate of the present embodiment is excellent in close contacting force between layers and productivity (yield rate).

On a surface of the core base material, a conductor circuit is usually formed from a metal foil of a metal foil-clad laminate used in the art, or a conductor layer obtained by peeling the metal foil, followed by plating or the like. The core base material is not especially limited, and typically, a patterned conductor layer (circuit) is formed on one surface or both surfaces of a substrate such as a glass epoxy substrate, a metal substrate, a polyester substrate, a polyimide substrate, a bismaleimide triazine resin substrate, or a thermosetting polyphenylene ether substrate. An inner layer circuit substrate of an intermediate product in which an insulating resin layer and/or a conductor layer is supposed to further be formed in producing multilayer printed wiring boards is also included in the circuit substrate according to the present embodiment. It is preferable that the conductor layer (circuit) surface should be subjected to roughening treatment in advance by blackening treatment or the like, from the viewpoint of close contact with the circuit substrate of the insulating resin layer. Although the metal foil is not especially limited, see, for example, the metal foil described above. Although the conductor layer is not especially limited, see, for example, the conductor layer described above.

In the present embodiment, the buildup is a method for laminating the resin composition layer in a semi-cured state in the laminate of the present embodiment onto this surface conductor circuit. Then, the resin in a semi-cured state can usually be completely cured by heat treatment or the like to thereby obtain a printed wiring board.

In production of the printed wiring board, if necessary, hole drilling to make a via hole and/or a through-hole is carried out in order to electrically connect conductor layers. The hole drilling is usually performed using a mechanical drill, carbon dioxide laser, UV laser, and YAG laser, etc.

In the case of carrying out this hole drilling, it is preferable to then carry out roughening treatment including desmear treatment. The roughening treatment usually involves a swelling step, a surface roughening and smear dissolution step, and a neutralization step.

The swelling step is carried out by swelling a surface of the insulating resin layer using a swelling agent. The swelling agent is not especially limited, and is preferably a swelling agent that improves the surface wettability of the insulating resin layer, and can swell the surface of the insulating resin layer to an extent in which oxidative decomposition is accelerated in the subsequent surface roughening and smear dissolution step. Specific examples thereof include alkali solutions and surfactant solutions.

The surface roughening and smear dissolution step is carried out using an oxidant. Examples of the oxidant include, but are not especially limited to, alkaline permanganate solutions. Potassium permanganate aqueous solutions and sodium permanganate aqueous solutions are preferred. Such oxidant treatment is called wet desmear treatment. The wet desmear treatment may be carried out in appropriate combination with other well-known roughening treatments such as dry desmear treatment based on plasma treatment and UV treatment, machine polishing using buff or the like, and sand blast.

The neutralization step neutralizes the oxidant used in the preceding step with a reducing agent. Examples of the reducing agent include amine-based reducing agents. Acidic aqueous solutions such as hydroxylamine sulfate aqueous solutions, ethylenediaminetetraacetic acid aqueous solutions, and nitrilotriacetic acid aqueous solutions are preferable.

In the present embodiment, it is preferable to carry out metal plating treatment after establishment of a via hole and/or a through-hole or after desmear treatment of the inside of a via hole and/or a through-hole, in order to electrically connect conductor layers.

A method of the metal plating treatment is not especially limited, and a method of metal plating treatment in usual production of printed wiring boards can be appropriately used. The method of the metal plating treatment and the kind of a chemical solution for use in the plating are not especially limited, and a method of metal plating treatment and a chemical solution in usual production of printed wiring boards can be appropriately used. The chemical solution for use in the metal plating treatment may also be a commercially available product.

The metal plating treatment method is not especially limited, and examples thereof include treatment with a degreasing liquid, treatment with a soft etchant, washing with an acid, treatment with a predipping solution, treatment with a catalyst liquid, treatment with an accelerator solution, treatment with a chemical copper solution, and a treatment in which acid washing is carried out, the object is dipped in a copper sulfate solution, and a current is made to flow.

The metal plating step of forming a conductor layer for the resin composition layer is carried out, for example, by forming the conductor layer by a combined method of electroless plating and electroplating on a resin composition layer surface with asperities formed thereon by roughening treatment, or by forming the conductor layer only by electroless plating. The conductor layer can be formed from, for example, metals such as copper, aluminum, nickel, silver, and gold, and alloys of these metals, and copper is more preferable. The copper plating layer can be formed by a combined method of electroless copper plating and copper electroplating, or a plating resist can be formed in a pattern opposite to that of the conductor layer and the conductor layer can be formed only by electroless copper plating.

Examples of a circuit formation process include a semi-additive process, a full-additive process, and a subtractive process. Among them, a semi-additive process is preferable from the viewpoint of forming fine wiring patterns.

Examples of an approach of pattern formation by the semi-additive process include, but are not especially limited to, an approach in which a thin conductor layer is formed by electroless plating or the like on an insulating resin layer surface, and then selectively subjected to electroplating (pattern plating) using a plating resist, which is then stripped, and the whole of the resultant is etched in an appropriate amount to form a wiring pattern.

It is preferable to carry out a drying step after plating, from the viewpoint of improving the adhesion strength between the insulating resin layer and the conductor layer in forming wiring patterns by plating. In pattern formation by the semi-additive process, electroless plating and electroplating are performed in combination. In this respect, it is preferable to carry out drying both after the electroless plating and after the electroplating. It is preferable that the drying after the electroless plating should be performed, for example, at 80 to 180° C. for 10 to 120 minutes, and it is preferable that the drying after the electroplating should be performed, for example, at 130 to 220° C. for 10 to 120 minutes. The plating is preferably copper plating.

When the insulating resin layer is present on the surface of the printed wiring board, this resin composition layer is subjected to surface treatment. A conductor layer is established thereon by plating or the like, and a pattern circuit can be formed using this conductor layer. In the case of forming a pattern by plating, it is preferable to perform roughening treatment of a resin composition layer surface before plating treatment.

A vacuum pressure-type laminator can suitably be used in a lamination method in the buildup process. In this case, a method of lamination via an elastic body such as rubber for the laminate of the present embodiment is preferable. Lamination conditions are not especially limited as long as the conditions are generally used in the art. The lamination is carried out, for example, at a temperature of 70 to 140° C. and a contact pressure of 1 to 11 kgf/cm$^2$ under a reduced pressure atmosphere of 20 hPa or lower. After the lamination step, the laminated adhered film may be smoothened by heat pressing using a metal plate. The lamination step and the smoothening step can be continuously performed using a commercially available vacuum pressure-type laminator. After the lamination step or after the smoothening step, a thermal curing step can be carried out. The thermal curing step completely cures the resin composition. Thermal curing conditions differ depending on the kind of the resin composition, etc. Usually, the curing temperature is 170 to 190° C., and the curing time is 15 to 60 minutes.

In the present embodiment, an insulating resin layer and/or a conductor layer may further be laminated onto the printed wiring board to obtain a multilayer printed wiring board. An inner layer of the multilayer printed wiring board may have a circuit substrate. The laminate of the present embodiment constitutes one of the insulating resin layers of the multilayer printed wiring board. Hence, according to the present embodiment, a thin and high-strength multilayer printed wiring board in which high-density fine wiring is formed can be obtained.

A lamination method is not especially limited, and a method generally used for forming usual printed wiring boards by lamination can be used. Examples of the lamination method include multiplaten presses, multiplaten vacuum presses, laminators, vacuum laminators, and autoclave forming machines. The temperature at the time of lamination is not especially limited, and is, for example, 100 to 300° C. The pressure is not especially limited, and is, for example, 0.1 to 100 kgf/cm$^2$ (approximately 9.8 kPa to approximately 9.8 MPa). The heating time is not especially limited, and is appropriately selected within the range of, for example, 30 seconds to 5 hours. If necessary, post-curing may be carried out in a temperature range of, for example, 150 to 300° C. to thereby adjust the degree of curing.

[Substrate for Loading Semiconductor Device]

The substrate for loading a semiconductor device can be obtained, for example, by laminating an insulating resin layer and a conductor layer onto the metal foil-clad laminate of the present embodiment. Although the insulating resin layer and the conductor layer are not especially limited, see, for example, the insulating resin layer and the conductor layer described above. Alternatively, the substrate for loading a semiconductor device may be obtained by a production method containing a step of further forming a circuit pattern by a subtractive process on an outer layer of the laminate of the present embodiment. The circuit pattern may be formed on only one surface of the laminate or may be formed on each of both surfaces. A method for forming the circuit pattern by the subtractive process is not especially limited, and may be a method carried out in production of usual printed wiring boards.

[Multilayer Coreless Substrate (Multilayer Printed Wiring Board)]

The laminate of the present embodiment can be used in production of coreless substrates. One example of the coreless substrate includes a multilayer coreless substrate.

The multilayer coreless substrate has, for example, one or a plurality of conductor layers laminated on each of both surfaces of the laminate of the present embodiment, and an insulating resin layer placed between every two of the plurality of conductor layers. Although the insulating resin layer and the conductor layer are not especially limited, see, for example, the insulating resin layer and the conductor layer described above. Each conductor layer may be patterned. The multilayer coreless substrate may also have a via hole and/or a through-hole through which conductor layers are electrically connected. The patterning, the via hole and the through-hole, and methods for fabricating these holes are not especially limited. See the description above.

The multilayer coreless substrate can be obtained by, for example, the following method containing a step of laminating the first resin composition layer or the second resin composition layer for the laminate of the present embodiment onto a conductor layer surface.

First, on each of both surfaces of a prepreg (e.g., GHPL-830NS ST56 (trade name) manufactured by Mitsubishi Gas Chemical Co., Ltd., thickness: 0.100 mm) converted into B stage, a metal foil having a peeling layer (e.g., PCS (trade name) manufactured by JX Nippon Mining & Metals Corp., copper foil thickness: 12 μm) is disposed such that the peeling layer surface faces the prepreg side. Vacuum pressing is carried out under conditions involving a temperature of 180 to 220° C., a pressure of 2 to 3 MPa, and a holding time of 60 to 120 minutes. Thereby, the prepreg is cured so that an insulating resin layer is formed to obtain a support substrate provided with the peeling layer and the metal foil in this order on each of both surfaces of this insulating resin layer.

Subsequently, the first resin composition layer for the laminate of the present embodiment is disposed on the metal foil surface of each of both surfaces of the support substrate. Further, a metal foil (e.g., 3EC-VLP (trade name) manufactured by Mitsui Mining & Smelting Co., Ltd., copper foil thickness: 12 μm) is disposed on the surface of the second resin composition layer for the laminate of the present embodiment. Vacuum pressing is carried out under conditions involving a temperature of 180 to 220° C., a pressure of 2 to 3 MPa, and a holding time of 60 to 120 minutes to obtain a metal foil-clad laminate. It is preferable that the metal foil surface of each of both surfaces of the support substrate should be subjected to well-known roughening treatment, in order to obtain close contact with the first resin composition layer. Examples of such roughening treatment include methods using a copper surface roughening liquid (e.g., CZ-8100 (trade name) manufactured by MEC Co., Ltd.).

Subsequently, the metal foil disposed on each of both surfaces of the metal foil-clad laminate thus obtained is etched into a predetermined wiring pattern so that a conductor layer is formed to obtain a laminate having a patterned metal foil. Although the patterning is not especially limited, see the description above.

Subsequently, on the metal foil surface of each of both surfaces of the laminate having a patterned metal foil thus obtained, an insulating resin layer having a metal foil (e.g., CRS-381NSI (trade name) manufactured by Mitsubishi Gas Chemical Co., Ltd., thickness: 15 μm) is disposed such that the insulating resin layer surface side faces the metal foil side of the laminate having a patterned metal foil. Vacuum pressing is carried out under conditions involving a temperature of 180 to 220° C., a pressure of 2 to 3 MPa, and a holding time of 60 to 120 minutes to obtain a metal foil-clad laminate. It is preferable that the metal foil surface of the laminate having a patterned metal foil should be subjected to well-known roughening treatment, in order to obtain close contact with the insulating resin layer. Examples of such roughening treatment include methods using a copper surface roughening liquid (e.g., CZ-8100 (trade name) manufactured by MEC Co., Ltd.). Although the insulating resin layer and the metal foil are not especially limited, see the insulating resin layer and the metal foil described above.

Subsequently, in the metal foil-clad laminate thus obtained, the peeling layer serving as a boundary portion between each metal foil having a peeling layer and the insulating resin layer disposed in the support substrate is peeled by the application of physical force to thereby peel two coreless substrates from the support substrate. The upper and lower metal foils of each of the obtained coreless substrates are subjected to half etching and drilling for a via hole and/or a through-hole, etc. using a laser beam processing instrument, and then electroless plating and/or electroplating so that a predetermined wiring pattern is formed to obtain a multilayer coreless substrate. A well-known method can be used in the half etching. Examples thereof include, but are not especially limited to, etching with hydrogen peroxide and sulfuric acid solutions. Although the drilling, the electroless plating, and the electroplating are not especially limited, see the methods described above.

EXAMPLES

Hereinafter, the present invention will be described further specifically with reference to Examples. However, the present invention is not limited by these Examples by any means.

Example 1

(Fabrication of Laminate 1A)

400 parts by mass of 2,2'-bis(4-cyanatephenyl)propane were melted at 150° C., and reacted for 4 hours with stirring to obtain a prepolymer having a mass-average molecular weight of 1,900 based on polystyrene in gel permeation chromatography (GPC). This prepolymer was dissolved in 200 parts by mass of methyl ethyl ketone to prepare varnish 1. 600 parts by mass (whole amount) of this varnish 1 were blended with 100 parts by mass of a bisphenol A-based epoxy resin (Epikote® 828 (trade name) manufactured by Japan Epoxy Resins Co., Ltd.), 150 parts by mass of a bisphenol F-based epoxy resin (EXA830LVP (trade name) manufactured by DIC Corp.), 150 parts by mass of a phenol novolac-based epoxy resin (DEN438 (trade name) manufactured by The Dow Chemical Company), and 200 parts by mass of a cresol novolac-based epoxy resin (ESCN220F (trade name) manufactured by Sumitomo Chemical Industry Co., Ltd.) as epoxy resins that were in a liquid state at room temperature. 0.3 parts by mass of acetyl acetone iron as a curing catalyst were dissolved in 100 parts by mass of methyl ethyl ketone, and added thereto. The mixture was well stirred and mixed to prepare homogenous varnish 2. Then, the viscosity of the varnish 2 was adjusted to 50 mPa·s by the addition of methyl ethyl ketone. The amount of the solvent in the varnish was 120% by mass based on 100% by mass of the varnish.

Both surfaces of a surface-smooth heat-resistant film layer (thickness: 7 µm, polyimide resin, Kapton® manufactured by Du Pont-Toray Co., Ltd.) were coated with the varnish 2 using a gravure coating apparatus (120R-75 (trade name) manufactured by Techno Smart Corp.), and dried so that a first resin composition layer converted into B stage and a second resin composition layer converted into B stage were formed to obtain laminate 1 in which the first resin composition layer converted into B stage, the heat-resistant film layer and the second resin composition layer converted into B stage were laminated in this order. The uniformity of the film thickness in the continuous length direction and the uniformity of the film thickness in the width direction were each within 20%.

(Fabrication of Copper Foil-Clad Laminate 2A)

On the surface of each of the first resin composition layer and the second resin composition layer in the laminate 1 thus obtained, a copper foil (thickness: 12 µm, 3EC-VLP (trade name) manufactured by Mitsui Mining & Smelting Co., Ltd.) was disposed such that the matte surface side faced the surface. Pressing treatment was carried out under vacuum (reduced pressure) at a heating temperature of 200° C. and a pressing pressure of 3 MPa in the lamination direction for 60 minutes to obtain copper foil-clad laminate 2A.

(Fabrication of Laminate Having Patterned Copper Foil, 3A)

On each of both the copper foil surfaces of the copper foil-clad laminate 2A thus obtained, a photosensitive dry film resist (RD-1225 (trade name) manufactured by Hitachi Chemical Co., Ltd.) was laminated at a temperature of 110±10° C. and a pressure of 0.50±0.02 MPa. Then, the laminated dry film resist was exposed according to a predetermined circuit pattern for masking. Thereafter, the dry film resist of both the surfaces was subjected to a development treatment with an aqueous solution of 1% by mass of sodium carbonate, and portions of the copper foil which were not covered with the etching resist were removed with a cupric chloride aqueous solution; and finally, the dry film resist was stripped in an amine-based resist stripping solution (Clean Etch® EF-105A R-100 (trade name) manufactured by Ryoko Chemical Co., Ltd.) to obtain laminate having a patterned copper foil, 3A.

Example 2

A 3-layer coreless substrate was fabricated according to the steps shown in FIG. 1.

(Fabrication of Support Substrate 1B)

On each of both surfaces of a prepreg (thickness: 0.100 mm, GHPL-830NS ST56 (trade name) manufactured by Mitsubishi Gas Chemical Co., Ltd.) converted into B stage by impregnation of a glass cloth (glass fibers) with a bismaleimide triazine resin (BT resin), a copper foil having a peeling layer (PCS (trade name) manufactured by JX Nippon Mining & Metals Corp.), which was formed by coating of copper foil 13 having a thickness of 12 µm with peeling layer 12 composed of a silane compound, was disposed such that the peeling layer 12 surface was in contact with the prepreg. Then, vacuum pressing was carried out under conditions involving a temperature of 220±2° C., a pressure of 5±0.2 MPa, and a holding time of 60 minutes. The prepreg was cured so that insulating resin layer 11 was formed to fabricate support substrate 1B provided with the peeling layer 12 and the copper foil 13 in this order on each of both surfaces of the insulating resin layer 11.

(Fabrication of Laminate 2B)

In Example 1, varnish 2 was prepared (viscosity: 60 mPa, the amount of the solvent in the varnish: 120% by mass) by the same production method as in Example 1. This varnish 2 was used to obtain laminate 2B in which first resin composition layer 21 converted into B stage, heat-resistant film layer 22, and second resin composition layer 23 converted into B stage were laminated in this order.

(Fabrication of Copper Foil-Clad Laminate 3B)

In order to obtain close contacting force with the first resin composition layer 21 in the laminate 2B, the surfaces of the support substrate 1B were subjected to roughening treatment using a copper surface roughening liquid (CZ-8100 (trade name) manufactured by MEC Co., Ltd.). Subsequently, the first resin composition layer 21 of the laminate 2B thus obtained was disposed on each of the copper foil 13 surfaces of both surfaces of the support substrate 1B. Further, on the second resin composition layer 23 disposed on each of both surfaces of the laminate 2B, copper foil 31 (thickness: 12 µm, 3EC-VLP (trade name) manufactured by Mitsui Mining & Smelting Co., Ltd.) was disposed such that the matte surface side faced the surface. Pressing treatment was carried out under vacuum (reduced pressure) at a heating temperature of 200° C. and a pressing pressure of 3 MPa in the lamination direction for 60 minutes to obtain copper foil-clad laminate 3B.

(Fabrication of Laminate Having Patterned Copper Foil, 4B)

On each of both the copper foil 31 surfaces of the copper foil-clad laminate 3B thus obtained, a photosensitive dry film resist (RD-1225 (trade name) manufactured by Hitachi Chemical Co., Ltd.) was laminated at a temperature of 110±10° C. and a pressure of 0.50±0.02 MPa. Then, the laminated dry film resist was exposed according to a predetermined circuit pattern for masking. Thereafter, the dry film resist of both the surfaces was subjected to a development treatment with an aqueous solution of 1% by mass of sodium carbonate, and portions of the copper foil 31 which were not covered with the etching resist were removed with a cupric chloride aqueous solution; and finally, the dry film resist was stripped in an amine-based resist stripping solution (Clean Etch® EF-105A R-100 (trade name) manufactured by Ryoko Chemical Co., Ltd.) to obtain laminate having a patterned copper foil, 4B.

(Fabrication of Copper Foil-Clad Laminate 5B)

In order to obtain close contacting force of the laminate having a patterned copper foil, 4B with insulating resin layer 51, the copper foil 31 surfaces of this laminate having a patterned copper foil, 4B were subjected to roughening treatment using a copper surface roughening liquid (CZ-8100 (trade name) manufactured by MEC Co., Ltd.). Subsequently, on each of both the copper foil 31 surfaces of this laminate having a patterned copper foil, 4B, an insulating resin layer having a copper foil (CRS-381NSI (trade name) manufactured by Mitsubishi Gas Chemical Co., Ltd., thickness: 15 µm) was disposed such that the insulating resin layer 51 surface side faced the surface. Pressing treatment was carried out under vacuum (reduced pressure) at a heating temperature of 200° C. and a pressing pressure of 3 MPa in the lamination direction for 60 minutes to obtain copper foil-clad laminate 5B in which copper foils 52 were laminated on the outermost surfaces.

(Fabrication of 3-Layer Coreless Substrate 6B)

In the copper foil-clad laminate 5B thus obtained, the boundary portion (peeling layer 12) between each copper foil 13 and the insulating resin layer 11 disposed in the support substrate 1B was peeled by the application of physical force to obtain 3-layer coreless substrate 6B. Then, half etching was performed, and roughening treatment including carbon dioxide laser beam processing and desmear treatment was carried out to form a via hole at the desired position. Then, copper layers were formed in the conductor layer and the outer layer by electroless copper plating and copper electroplating in combination. Then, a pattern circuit was formed by the semi-additive process to obtain patterned 3-layer coreless substrate 7B.

Comparative Example 1

(Fabrication of Laminate 1C)

In Example 1, varnish 2 was prepared (viscosity: 100 mPa, the amount of the solvent in the varnish: 30% by mass) by the same production method as in Example 1. This varnish 2 was used to obtain laminate 1C in which a first resin composition layer converted into B stage, a heat-resistant film layer, and a second resin composition layer converted into B stage were laminated in this order.

(Fabrication of Copper Foil-Clad Laminate 2C and Laminate Having Patterned Copper Foil, 3C)

Copper foil-clad laminate 2C, and laminate having a patterned copper foil, 3C were obtained in the same way as in Example 1 using the laminate 1C thus obtained.

Comparative Example 2

(Fabrication of Support Substrate 1D)

On each of both surfaces of a prepreg (thickness: 0.100 mm, GHPL-830NS ST56 (trade name) manufactured by Mitsubishi Gas Chemical Co., Ltd.) converted into B stage by impregnation of a glass cloth (glass fibers) with a bismaleimide triazine resin (BT resin), a copper foil having a peeling layer (PCS (trade name) manufactured by JX Nippon Mining & Metals Corp.), which was formed by coating of a copper foil having a thickness of 12 μm with a peeling layer composed of a silane compound, was disposed such that the peeling layer surface was in contact with the prepreg. Then, vacuum pressing was carried out under conditions involving a temperature of 220±2° C., a pressure of 5±0.2 MPa, and a holding time of 60 minutes. The prepreg was cured so that an insulating resin layer was formed to fabricate support substrate 1D provided with the peeling layer and the copper foil in this order on each of both surfaces of the insulating resin layer.

(Fabrication of Laminate 2D)

In Example 1, varnish 2 was prepared (viscosity: 50 mPa, the amount of the solvent in the varnish: 30% by mass) by the same production method as in Example 1. This varnish 2 was used to obtain laminate 2D in which a first resin composition layer converted into B stage, a heat-resistant film layer, and a second resin composition layer converted into B stage were laminated in this order.

(Fabrication of Copper Foil-Clad Laminate 3D)

In order to obtain close contacting force with the first resin composition layer in the laminate 2D, the surfaces of the support substrate 1D were subjected to roughening treatment using a copper surface roughening liquid (CZ-8100 (trade name) manufactured by MEC Co., Ltd.). Subsequently, the first resin composition layer of the laminate 2D thus obtained was disposed on each of the copper foil surfaces of both surfaces of the support substrate 1D. Further, on the second resin composition layer disposed on each of both surfaces of the laminate 2D, a copper foil (thickness: 12 μm, 3EC-VLP (trade name) manufactured by Mitsui Mining & Smelting Co., Ltd.) was disposed such that the matte surface side faced the surface. Pressing treatment was carried out under vacuum (reduced pressure) at a heating temperature of 200° C. and a pressing pressure of 3 MPa in the lamination direction for 60 minutes to obtain copper foil-clad laminate 3D.

(Fabrication of Laminate Having Patterned Copper Foil, 4D)

On each of both the copper foil surfaces of the copper foil-clad laminate 3D thus obtained, a photosensitive dry film resist (RD-1225 (trade name) manufactured by Hitachi Chemical Co., Ltd.) was laminated at a temperature of 110±10° C. and a pressure of 0.50±0.02 MPa. Then, the laminated dry film resist was exposed according to a predetermined circuit pattern for masking. Thereafter, the dry film resist of both the surfaces was subjected to a development treatment with an aqueous solution of 1% by mass of sodium carbonate, and portions of the copper foil which were not covered with the etching resist were removed with a cupric chloride aqueous solution; and finally, the dry film resist was stripped in an amine-based resist stripping solution (Clean Etch® EF-105A R-100 (trade name) manufactured by Ryoko Chemical Co., Ltd.) to obtain laminate having a patterned copper foil, 4D.

(Fabrication of Copper Foil-Clad Laminate 5D)

In order to obtain close contacting force of the laminate having a patterned copper foil, 4D with an insulating resin layer, the copper foil surfaces of this laminate having a patterned copper foil, 4D were subjected to roughening treatment using a copper surface roughening liquid (CZ-8100 (trade name) manufactured by MEC Co., Ltd.). Subsequently, on each of both the copper foil surfaces of this laminate having a patterned copper foil, 4D, an insulating resin layer having a copper foil (CRS-381NSI (trade name) manufactured by Mitsubishi Gas Chemical Co., Ltd., thickness: 15 μm) was disposed such that the insulating resin layer surface side faced the surface. Pressing treatment was carried out under vacuum (reduced pressure) at a heating temperature of 200° C. and a pressing pressure of 3 MPa in the lamination direction for 60 minutes to obtain copper foil-clad laminate 5D in which copper foils were laminated on the outermost surfaces.

(Fabrication of 3-Layer Coreless Substrate 6D)

In the copper foil-clad laminate 5D thus obtained, the boundary portion (peeling layer) between each copper foil and the insulating resin layer disposed in the support substrate 1D was peeled by the application of physical force to obtain 3-layer coreless substrate 6D. Then, half etching was performed, and roughening treatment including carbon dioxide laser beam processing and desmear treatment was carried out to form a via hole at the desired position. Then, copper layers were formed in the conductor layer and the outer layer by electroless copper plating and copper electroplating in combination. Then, a pattern circuit was formed by the semi-additive process to obtain patterned 3-layer coreless substrate 7D.

[Measurement and Evaluation Methods]

(1) Measurement of Film Thickness of Resin Composition Layer

The respective maximum thicknesses and minimum thicknesses of the first resin composition layers and the second resin composition layers in the laminates 1A, 2B, 1C, and 2D obtained in Examples and Comparative Examples were measured using Micro-Watcher (VH-7000 (brand name) manufactured by Keyence Corp., 450×). Averages thicknesses and a difference between a maximum thickness and a minimum thickness was calculated using the measured maximum thicknesses and minimum thicknesses. The results are shown in Table 1.

(2) Measurement Test of Void

The laminates having a patterned copper foil, 3A, 4B, 3C, and 4D obtained in Examples and Comparative Examples were used. The copper foils were removed from both surfaces of each laminate having a patterned copper foil. The presence or absence of voids on both surfaces of the laminate after the removal was confirmed by visual inspection. Evaluation was made as "AA" when void generation was not found and "CC" when void generation was found. A laminate evaluated as "AA" means that thin and yet high-strength printed wiring boards, multilayer coreless substrates and substrates for loading semiconductor devices can be produced. The results are shown in Table 1.

(3) Deliverability Test

Each laminate (having the first resin composition layer, the heat-resistant film layer and the second resin composition layer in this order) after copper foil removal used in the measurement test of voids was prepared into a rectangular shape of 100 mm×50 mm, then charged into a peeling line (peeling section of the peeling line of Eminent Development Etching, pressure: 0.1 MPa, manufactured by Tokyo Kakoki Co., Ltd.), washed with water, and delivered to thereby confirm the presence or absence of damage in the laminate.

The area of the laminate before washing with water and delivery was defined as A, and the area of an undamaged portion in the laminate after washing with water and delivery was defined as B. Evaluation was made as "AA" when the value of (B/A)×100 was larger than 99% and "CC" for the other cases. A laminate evaluated as "AA" is thin and yet has high strength, and means that printed wiring boards, multilayer coreless substrates and substrates for loading semiconductor devices can be produced even using existing apparatuses. The results are shown in Table 1.

The present application is based on the Japanese patent application filed on Aug. 30, 2018 (Japanese Patent Application No. 2018-161406), the contents of which are incorporated herein by reference in their entirety.

INDUSTRIAL APPLICABILITY

The laminate of the present invention can be used in production of electronic apparatuses, communication apparatuses, and personal computers and the like, and is useful as a buildup material for printed wiring boards and substrates for loading semiconductor devices, etc.

REFERENCE SIGNS LIST

1B . . . Support substrate, 11 . . . Insulating resin layer, 12 . . . Peeling layer, 13 . . . Copper foil, 2B . . . Laminate, 21 . . . First resin composition layer, 22 . . . Heat-resistant film layer, 23 . . . Second resin composition layer, 3B . . . Copper foil-clad laminate, 31 . . . Copper foil, 4B . . . Laminate having a patterned copper foil, 5B . . . Copper foil-clad laminate, 51 . . . Insulating resin layer, 52 . . . Copper foil, 6B . . . 3-layer coreless substrate, 7B . . . Patterned 3-layer coreless substrate

The invention claimed is:

1. A laminate comprising a first resin composition layer, a heat-resistant film layer, and a second resin composition layer laminated in the presented order, wherein
the first resin composition layer is in a semi-cured state (B stage), and a difference between a maximum thickness and a minimum thickness of the first resin composition layer is to 5 μm;
the second resin composition layer is in a semi-cured state (B stage), and a difference between a maximum thickness and a minimum thickness of the second resin composition layer is 0.5 to 5 μm;
the first resin composition layer is laminated onto the heat-resistant film layer by gravure coating using a first varnish comprising a first resin composition and a first solvent;

TABLE 1

| | | | Example 1 | Example 2 | Comparative Example 1 | Comparative Example 2 |
|---|---|---|---|---|---|---|
| First resin composition layer | Maximum thickness | (μm) | 5 | 8 | 8 | 9 |
| | Minimum thickness | (μm) | 3 | 3 | 2 | 1 |
| | Average thickness | (μm) | 4 | 4 | 4 | 4 |
| | Difference between maximum thickness and minimum thickness | (μm) | 2 | 3 | 6 | 8 |
| Second resin composition layer | Maximum thickness | (μm) | 5 | 8 | 8 | 9 |
| | Minimum thickness | (μm) | 3 | 3 | 2 | 1 |
| | Average thickness | (μm) | 4 | 4 | 4 | 4 |
| | Difference between maximum thickness and minimum thickness | (μm) | 2 | 3 | 6 | 8 |
| Presence or absence of void generation | | — | AA | AA | CC | CC |
| Deliverability test | | — | AA | AA | CC | CC | the second resin composition layer is laminated onto the heat-resistant film layer by gravure coating using a second varnish comprising a second resin composition a second solvent;

the first varnish and the second varnish are the same or different;

the amount of the first solvent in the first varnish is in the range of 40 to 400% by mass based on 100% by mass of the first varnish;

the amount of the second solvent in the second varnish is in the range of 40 to 400% by mass based on 100% by mass of the second varnish; and the first and second resin composition layers are formed via the gravure coating such that the first and second resin composition layers have a uniform thickness on both surfaces of the heat-resistant film layer.

2. The laminate according to claim 1, wherein a thickness of the heat-resistant film layer is 1 to 20 μm.

3. The laminate according to claim 1, wherein the heat-resistant film layer comprises one or more resins selected from the group consisting of a polyimide resin, a polyamide imide resin, a nylon resin, and a fluorine resin.

4. The laminate according to claim 1, wherein the first resin composition layer comprises one or more resins selected from the group consisting of a phenolic resin, an epoxy resin, a cyanate resin, a maleimide resin, an isocyanate resin, a benzocyclobutene resin, a bismaleimide triazine resin, and a vinyl resin.

5. The laminate according to claim 1, wherein the second resin composition layer comprises one or more resins selected from the group consisting of a phenolic resin, an epoxy resin, a cyanate resin, a maleimide resin, an isocyanate resin, a benzocyclobutene resin, a bismaleimide triazine resin, and a vinyl resin.

6. The laminate according to claim 1, for use in a printed wiring board.

7. A metal foil-clad laminate comprising
the laminate according to claim 1, and
a metal foil disposed on one surface or both surfaces of the laminate.

8. A laminate having a patterned metal foil, comprising
the laminate according to claim 1, and
a patterned metal foil disposed on one surface or both surfaces of the laminate.

9. A laminate having a buildup structure, comprising
the laminate according to claim 1, and
a conductor layer alternately laminated.

10. A printed wiring board comprising the laminate according to claim 1.

11. A multilayer coreless substrate comprising
the laminate according to claim 1, and
one or a plurality of conductor layers disposed on each of both surfaces of the laminate, and comprising
an insulating resin layer placed between every two of the plurality of conductor layers.

12. A method for producing a multilayer coreless substrate, comprising laminating the first resin composition layer or the second resin composition layer for the laminate according to claim 1 onto a conductor layer surface; wherein
the first resin composition layer is laminated onto the heat-resistant film layer by gravure coating using a first varnish comprising a first resin composition and a first solvent;

the second resin composition layer is laminated onto the heat-resistant film layer by gravure coating using a second varnish comprising a second resin composition a second solvent;

the first varnish and the second varnish are the same or different;

the amount of the first solvent in the first varnish is in the range of 40 to 400% by mass based on 100% by mass of the first varnish; and the amount of the second solvent in the second varnish is in the range of 40 to 400% by mass based on 100% by mass of the second varnish.

13. A method for producing the laminate according to claim 1, comprising:
laminating a first resin composition layer onto the heat-resistant film layer by gravure coating using a first varnish comprising a first resin composition and a first solvent, and laminating a second resin composition layer onto a portion of the heat-resistant film layer that was not laminated by the first resin composition layer by gravure coating using a second varnish comprising a second resin composition a second solvent, wherein the first varnish and the second varnish are the same or different, the amount of the first solvent in the first varnish is in the range of 40 to 400% by mass based on 100% by mass of the first varnish, and the amount of the second solvent in the second varnish is in the range of 40 to 400% by mass based on 100% by mass of the second varnish.

* * * * *

UNITED STATES PATENT AND TRADEMARK OFFICE
CERTIFICATE OF CORRECTION

PATENT NO. : 11,877,396 B2
APPLICATION NO. : 17/271062
DATED : January 16, 2024
INVENTOR(S) : S. Hirano et al.

It is certified that error appears in the above-identified patent and that said Letters Patent is hereby corrected as shown below:

In the Claims

Column 33, Lines 3-4 (Claim 1, Lines 18-19) please change "composition a" to -- composition and a --

Column 34, Lines 18-19 (Claim 12, Lines 11-12) please change "composition a" to -- composition and a --

Column 34, Line 38 (Claim 13, Line 11) please change "composition a" to -- composition and a --

Signed and Sealed this
Eleventh Day of June, 2024

Katherine Kelly Vidal
*Director of the United States Patent and Trademark Office*